US012068412B2

(12) United States Patent
Kim et al.

(10) Patent No.: US 12,068,412 B2
(45) Date of Patent: Aug. 20, 2024

(54) POWER SEMICONDUCTOR DEVICE

(71) Applicant: HYUNDAI MOBIS Co., Ltd., Seoul (KR)

(72) Inventors: Sin A Kim, Yongin-si (KR); Tae Youp Kim, Yongin-si (KR); Jeong Mok Ha, Yongin-si (KR); Hyuk Woo, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 462 days.

(21) Appl. No.: 17/545,265

(22) Filed: Dec. 8, 2021

(65) Prior Publication Data

US 2022/0181485 A1    Jun. 9, 2022

(30) Foreign Application Priority Data

Dec. 9, 2020  (KR) .................. 10-2020-0171719
Dec. 9, 2020  (KR) .................. 10-2020-0171720
Dec. 9, 2020  (KR) .................. 10-2020-0171721

(51) Int. Cl.
*H01L 29/78*  (2006.01)
*H01L 27/088* (2006.01)
(Continued)

(52) U.S. Cl.
CPC ........ *H01L 29/7813* (2013.01); *H01L 27/088* (2013.01); *H01L 29/0657* (2013.01); *H01L 29/0865* (2013.01); *H01L 29/1608* (2013.01)

(58) Field of Classification Search
CPC ............... H01L 27/088; H01L 29/7813; H01L 29/0657; H01L 29/0865; H01L 29/1608
(Continued)

(56) References Cited

U.S. PATENT DOCUMENTS

2004/0124489 A1   7/2004  Tsukanov et al.
2007/0252195 A1*  11/2007 Yoshikawa ......... H01L 29/7397
                                                 257/E21.384
(Continued)

FOREIGN PATENT DOCUMENTS

JP     2009-094203 A    4/2009
JP     2013-236040 A   11/2013
(Continued)

OTHER PUBLICATIONS

Office Action issued in corresponding Korean Patent Application No. 10-2020-0171719 dated Jan. 20, 2022.
(Continued)

*Primary Examiner* — Igwe U Anya
(74) *Attorney, Agent, or Firm* — MORGAN, LEWIS & BOCKIUS LLP

(57) ABSTRACT

A power semiconductor device according to an aspect of the present disclosure includes a semiconductor layer of silicon carbide (SiC), a plurality of well regions that is disposed in the semiconductor layer, spaced from each other and has a second conductivity type, a plurality of source regions that are disposed in the semiconductor layer on the plurality of well regions respectively, spaced from each other, a drift region that has the first conductivity type and is disposed in the semiconductor layer, the drift region extending from a lower side of the plurality of well regions to a surface of the semiconductor layer through between the plurality of well regions, a plurality of trenches, a gate insulating layer, and a gate electrode layer that is disposed on the gate insulating layer.

20 Claims, 41 Drawing Sheets

(51) Int. Cl.
*H01L 29/06* (2006.01)
*H01L 29/08* (2006.01)
*H01L 29/16* (2006.01)

(58) Field of Classification Search
USPC .......................................................... 257/77
See application file for complete search history.

(56) References Cited

U.S. PATENT DOCUMENTS

2007/0278571 A1    12/2007  Bhalla et al.
2017/0179223 A1     6/2017  Nagao
2021/0376143 A1*   12/2021  Ha ..................... H01L 29/0886

FOREIGN PATENT DOCUMENTS

| KR | 10-2004-0044441 A | 5/2004 |
| KR | 10-2006-0132700 A | 12/2006 |
| KR | 10-2007-0015309 A | 2/2007 |
| KR | 10-2011-0049249 A | 5/2011 |
| KR | 10-2018-0001044 A | 1/2018 |

OTHER PUBLICATIONS

Office Action issued in corresponding Korean Patent Application No. 10-2020-0171720 dated Jan. 20, 2022.
Office Action issued in corresponding Korean Patent Application No. 10-2020-0171721 dated Jan. 20, 2022.

* cited by examiner

POWER SEMICONDUCTOR DEVICE

CROSS-REFERENCE TO RELATED APPLICATION

This application claims the benefit of priority to Korean Patent Application Nos. 10-2020-0171719, 10-2020-0171720, and 10-2020-0171721, filed in the Korean Intellectual Property Office on Dec. 9, 2020, the entire contents of which are incorporated herein by reference.

TECHNICAL FIELD

The present disclosure relates to a semiconductor device, and more particularly, relates to a power semiconductor device for switching a power transfer.

BACKGROUND

A power semiconductor device refers to a semiconductor device that operates in a high-voltage and high-current environment. The power semiconductor device is being used in a field requiring high-power switching, for example, is being used for power conversion, a power converter, an inverter, or the like. For example, the power semiconductor device may include an insulated gate bipolar transistor (IGBT), a power metal oxide semiconductor field effect transistor (MOSFET), or the like. The power semiconductor device basically requires a high withstand voltage characteristic, and nowadays, the power semiconductor device additionally requires a high-speed switching operation.

As such, a power semiconductor device that uses silicon carbide (SiC) instead of existing silicon (Si) is being developed. The silicon carbide (SiC) that is a wide gap semiconductor material whose bandgap is higher than that of the silicon may maintain stability even at a high temperature compared to the silicon. In addition, because a breakdown electric field of the silicon carbide is much higher than that of the silicon, the silicon carbide may stably operate even at a high temperature. Accordingly, the silicon carbide makes an operation possible at a high temperature through the following characteristics: a high breakdown voltage compared to the silicon and excellent heat emission.

In the case of the power semiconductor device using the silicon carbide, a bandgap of the silicon carbide surface may be upwardly bent due to the influence of negative charges coming from the formation of carbon clusters in a gate insulating layer. That is, a threshold voltage of the power semiconductor device may increase, and a channel resistance thereof may become greater. Also, there is a limitation in increasing a channel density only through an existing planar or trench structure.

SUMMARY

The present disclosure has been made to solve the above-mentioned problems occurring in the prior art while advantages achieved by the prior art are maintained intact.

An aspect of the present disclosure provides a silicon carbide-based power semiconductor device capable of increasing a channel density and making stability high. However, the above object is an example, and the scope and spirit of the present disclosure is not limited thereto.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a power semiconductor device may include a semiconductor layer of silicon carbide (SiC), a plurality of well regions that is disposed in the semiconductor layer, spaced from each other and has a second conductivity type, a plurality of source regions that are disposed in the semiconductor layer on the plurality of well regions respectively, spaced from each other and having a first conductivity type, a drift region that has the first conductivity type and is disposed in the semiconductor layer, the drift region extend from a lower side of the plurality of well regions to a surface of the semiconductor layer through between the plurality of well regions, a plurality of trenches that are disposed to be recessed to an inside of the semiconductor layer from the surface of the semiconductor layer such that each of the plurality of trenches connects two source regions adjacent to each other from among the plurality of source regions, a gate insulating layer that is disposed on inner walls of the plurality of trenches and the surface of the semiconductor layer, and a gate electrode layer that is disposed on the gate insulating layer and includes a first portion burying the plurality of trenches and a second portion on the surface of the semiconductor layer.

According to the power semiconductor device, distances between three well regions adjacent to each other from among the plurality of well regions may be equal to each other, and distances between three source regions adjacent to each other from among the plurality of source regions may be equal to each other.

According to the power semiconductor device, the drift region may include a protrusion extending to the surface of the semiconductor layer between three well regions adjacent to each other from among the plurality of well regions, and the second portion of the gate electrode layer may be disposed on the protrusion of the drift region and two adjacent well regions of the three adjacent well regions.

According to the power semiconductor device, centers of seven well regions adjacent to each other from among the plurality of well regions may be respectively disposed at a center and vertexes of a regular hexagon, and centers of seven source regions being on the seven adjacent well regions from among the plurality of source regions may be respectively disposed at the center and vertexes of the regular hexagon.

According to the power semiconductor device, the plurality of trenches may include portions of lines each connecting two adjacent to each other from among the center and vertexes of the regular hexagon such that the seven adjacent source regions are connected.

According to the power semiconductor device, a first channel region restricted to the semiconductor layer so as to correspond to the first portion of the gate electrode layer and so as to be connected with the drift region and the source regions being in contact with the plurality of trenches along the plurality of trenches, and a second channel region under the second portion of the gate electrode layer and restricted to the semiconductor layer so as to be in contact with the plurality of source regions may be further provided.

According to the power semiconductor device, the first channel region and the second channel region may have the second conductivity type such that an inversion channel is formed, and the first channel region and the second channel region may be portions of the plurality of well regions.

According to the power semiconductor device, the first channel region may have the second conductivity type such that an inversion channel is formed, the second channel region may have the first conductivity type such that an accumulation channel is formed, the first channel region may correspond to portions of the plurality of well regions, the second channel region may be a portion of the drift region, and the plurality of source regions may be in contact with the drift region, on the surface of the semiconductor layer.

According to the power semiconductor device, a plurality of well contact regions disposed in the plurality of source regions and on the plurality of well regions and having the second conductivity type, and a source electrode layer connected with the plurality of source regions and the plurality of well contact regions may be further provided.

According to the power semiconductor device, the plurality of well contact regions may have a circular shape in a plan view, and the plurality of source regions may have a shape of a doughnut surrounding the plurality of well contact regions.

According to the power semiconductor device, the plurality of well regions may have a shape in which a width thereof increases as the width goes to an inside of the semiconductor layer from the surface of the semiconductor layer and then decreases.

According to the power semiconductor device, opposite bottom corners of the first portion of the gate electrode layer may be surrounded by the plurality of well regions.

The power semiconductor device may further include a drain region in the semiconductor layer under the drift region and having the first conductivity type, and the drift region may includes an epitaxial layer on the drift region.

A power semiconductor device according to an aspect of the present disclosure for solving the problem may include a semiconductor layer of silicon carbide (SiC), a plurality of well regions that is disposed in the semiconductor layer and has a second conductivity type, a plurality of source regions disposed in the semiconductor layer on the plurality of well regions respectively and have a first conductivity type, a drift region that has the first conductivity type and disposed in the semiconductor layer, extend from a lower side of the plurality of well regions to a surface of the semiconductor layer through between the plurality of well regions, and provide a vertical transport path of charges, a plurality of trenches disposed to be recessed to an inside of the semiconductor layer from the surface of the semiconductor layer such that each of the plurality of trenches connects two source regions adjacent to each other from among the plurality of source regions, a gate insulating layer disposed on inner walls of the plurality of trenches and the surface of the semiconductor layer, a gate electrode layer disposed on the gate insulating layer and includes a first portion burying the plurality of trenches and a second portion on the surface of the semiconductor layer, a first channel region that is restricted to the semiconductor layer such that an inversion channel extends along the plurality of trenches to correspond to the first portion of the gate electrode layer, and a second channel region that is under the second portion of the gate electrode layer and is restricted to the semiconductor layer such that an accumulation channel is formed.

According to the power semiconductor device, distances between three well regions adjacent to each other from among the plurality of well regions may be equal to each other, and distances between three source regions adjacent to each other from among the plurality of source regions may be equal to each other.

According to the power semiconductor device, the drift region may include a protrusion extending to the surface of the semiconductor layer between three well regions adjacent to each other from among the plurality of well regions, and the second portion of the gate electrode layer may be disposed on the protrusion of the drift region and the two adjacent well regions of the three adjacent well regions.

According to the power semiconductor device, centers of seven well regions adjacent to each other from among the plurality of well regions may be respectively disposed at a center and vertexes of a regular hexagon, and centers of seven source regions being on the seven adjacent well regions from among the plurality of source regions may be respectively disposed at the center and vertexes of the regular hexagon.

According to the power semiconductor device, the plurality of trenches may form portions of lines each connecting two adjacent to each other from among the center and vertexes of the regular hexagon such that the seven adjacent source regions are connected.

According to the power semiconductor device, the first channel region may have the second conductivity type and may correspond to portions of the plurality of well regions.

According to the power semiconductor device, the plurality of source regions may be in contact with the drift region, on the surface of the semiconductor layer, and the second channel region may have the first conductivity type and may be a portion of the drift region being in contact with the plurality of source regions.

According to the power semiconductor device, the plurality of source regions may respectively include counter doping regions formed by doping impurities of the first conductivity type in the plurality of well regions, at portions where the plurality of source regions and the drift region contact each other.

According to the power semiconductor device, a plurality of well contact regions formed in the plurality of source regions and on the plurality of well regions and having the second conductivity type, and a source electrode layer connected with the plurality of source regions and the plurality of well contact regions may be further provided.

According to the power semiconductor device, the plurality of well contact regions may be formed in a circular shape in a plan view, and the plurality of source regions may be formed in the shape of a doughnut surrounding the plurality of well contact regions.

The power semiconductor device may further include a drain region in the semiconductor layer under the drift region and having the first conductivity type, and the drift region may be formed of an epitaxial layer on the drift region.

According to the power semiconductor device, the plurality of well regions may be formed such that two well regions adjacent to each other from among the well regions at least partially contact each other.

According to the power semiconductor device, the plurality of well regions may have a shape in which a width thereof increases as it goes to an inside of the semiconductor layer from the surface of the semiconductor layer and then decreases, and two well regions adjacent to each other from among the well regions may contact each other at a place where at least a width thereof is the largest within the semiconductor layer and may be spaced from each other on the surface of the semiconductor layer.

According to the power semiconductor device, when viewed from a cross section of the first portion of the gate electrode layer in an extending direction, a bottom surface of the first portion may be surrounded by the plurality of well regions on the whole.

According to the power semiconductor device, the plurality of well regions may be formed in the semiconductor layer so as to be spaced from each other, and the plurality of well regions may have a shape in which a width thereof increases as it goes to an inside of the semiconductor layer from the surface of the semiconductor layer and then decreases.

According to the power semiconductor device, opposite bottom corners of the first portion of the gate electrode layer may be surrounded by the plurality of well regions.

A power semiconductor device fabricating method according to another aspect of the present disclosure may include forming a drift region having a first conductivity type in a semiconductor layer of silicon carbide (SiC) to provide a vertical transport path of charges, forming a plurality of well regions having a second conductivity type in the semiconductor layer, forming a plurality of source regions having the first conductivity type, respectively, in the semiconductor layer on the plurality of well regions, forming a plurality of trenches to be recessed to an inside of the semiconductor layer from the surface of the semiconductor layer such that each of the plurality of trenches connects two source regions adjacent to each other from among the plurality of source regions, forming a gate insulating layer on inner walls of the plurality of trenches and the surface of the semiconductor layer, and forming, on the gate insulating layer, a gate electrode layer including a first portion burying the plurality of trenches and a second portion on the surface of the semiconductor layer. The drift region may be formed to extend from a lower side of the plurality of well regions to the surface of the semiconductor layer through between the plurality of well regions, the first channel region may be restricted to the semiconductor layer such that an inversion channel is formed along the plurality of trenches to correspond to the first portion of the gate electrode layer, and the second channel region may be under the second portion of the gate electrode layer and may be restricted to the semiconductor layer such that an accumulation channel is formed.

According to the power semiconductor device fabricating method, the plurality of well regions may be formed to have a shape in which a width thereof increases as it goes to an inside of the semiconductor layer from the surface of the semiconductor layer and then decreases.

According to the power semiconductor device fabricating method, the forming of the plurality of well regions may include forming the plurality of well regions such that centers of seven well regions adjacent to each other from among the plurality of well regions are respectively disposed at a center and vertexes of a regular hexagon.

A power semiconductor device according to an aspect of the present disclosure for solving the problem may include a semiconductor layer of silicon carbide (SiC), a plurality of well regions that are disposed in the semiconductor layer such that two adjacent well regions at least partially contact each other and have a second conductivity type, a plurality of source regions that are formed in the semiconductor layer on the plurality of well regions respectively and have a first conductivity type, a drift region that has the first conductivity type and is formed in the semiconductor layer so as to extend from a lower side of the plurality of well regions to a surface of the semiconductor layer through between the plurality of well regions and so as to provide a vertical transport path of charges, a plurality of trenches that are formed to be recessed to an inside of the semiconductor layer from the surface of the semiconductor layer such that each of the plurality of trenches connects two source regions adjacent to each other from among the plurality of source regions across a place where two well regions adjacent to each other among the plurality of well regions contact each other, a gate insulating layer that is formed on inner walls of the plurality of trenches and the surface of the semiconductor layer, and a gate electrode layer that is formed on the gate insulating layer and includes a first portion burying the plurality of trenches and a second portion on the surface of the semiconductor layer, According to the power semiconductor device, distances between three well regions adjacent to each other from among the plurality of well regions may be equal to each other, and distances between three source regions adjacent to each other from among the plurality of source regions may be equal to each other.

According to the power semiconductor device, the drift region may include a protrusion extending to the surface of the semiconductor layer between three well regions adjacent to each other from among the plurality of well regions, and the second portion of the gate electrode layer may be formed on the protrusion of the drift region and the two adjacent well regions.

According to the power semiconductor device, centers of seven well regions adjacent to each other from among the plurality of well regions may be respectively disposed at a center and vertexes of a regular hexagon, and centers of seven source regions being on the seven adjacent well regions from among the plurality of source regions may be respectively disposed at the center and vertexes of the regular hexagon.

According to the power semiconductor device, the plurality of trenches may form portions of lines each connecting two adjacent to each other from among the center and vertexes of the regular hexagon such that the seven adjacent source regions are connected.

According to the power semiconductor device, a first channel region restricted to the semiconductor layer so as to correspond to the first portion of the gate electrode layer and so as to be in contact with the drift region and the source regions being in contact with the plurality of trenches along the plurality of trenches, and a second channel region under the second portion of the gate electrode layer and restricted to the semiconductor layer so as to be in contact with the plurality of source regions may be further provided.

According to the power semiconductor device, the first channel region and the second channel region may have the second conductivity type such that an inversion channel is formed, and the first channel region and the second channel region may be portions of the plurality of well regions.

According to the power semiconductor device, the first channel region may have the second conductivity type such that an inversion channel is formed, the second channel region may have the first conductivity type such that an accumulation channel is formed, the first channel region may correspond to portions of the plurality of well regions, the second channel region may be a portion of the drift region, and the plurality of source regions may be in contact with the drift region, on the surface of the semiconductor layer.

According to the power semiconductor device, a plurality of well contact regions formed in the plurality of source regions and on the plurality of well regions and having the second conductivity type, and a source electrode layer connected with the plurality of source regions and the plurality of well contact regions may be further provided.

According to the power semiconductor device, the plurality of well contact regions may be formed in a circular shape in a plan view, and the plurality of source regions may be formed in the shape of a doughnut surrounding the plurality of well contact regions.

According to the power semiconductor device, the plurality of well regions may have a shape in which a width thereof increases as it goes to an inside of the semiconductor layer from the surface of the semiconductor layer and then decreases, and two well regions adjacent to each other from among the well regions may contact each other at a place where at least a width thereof is the largest within the semiconductor layer and may be spaced from each other on the surface of the semiconductor layer.

According to the power semiconductor device, in the first portion of the gate electrode layer, a cross section of a bottom surface in an extending direction may be surrounded by the plurality of well regions.

According to the power semiconductor device, when viewed from a cross section of the first portion of the gate electrode layer in an extending direction, a bottom surface of the first portion may be surrounded by the plurality of well regions on the whole.

The power semiconductor device may further include a drain region in the semiconductor layer under the drift region and having the first conductivity type, and the drift region may be formed of an epitaxial layer on the drift region.

A power semiconductor device fabricating method according to another aspect of the present disclosure may include forming a drift region having a first conductivity type in a semiconductor layer of silicon carbide (SiC) to provide a vertical transport path of charges, forming a plurality of well regions having a second conductivity type in the semiconductor layer such that two adjacent well regions at least partially contact each other, forming a plurality of source regions having the first conductivity type, respectively, in the semiconductor layer on the plurality of well regions, forming a plurality of trenches to be recessed to an inside of the semiconductor layer from a surface of the semiconductor layer such that each of the plurality of trenches connects two source regions adjacent to each other from among the plurality of source regions across a place where two well regions adjacent to each other among the plurality of well regions contact each other, forming a gate insulating layer on inner walls of the plurality of trenches and the surface of the semiconductor layer, and forming, on the gate insulating layer, a gate electrode layer including a first portion burying the plurality of trenches and a second portion on the surface of the semiconductor layer. The drift region may be formed to be in contact with the drift region such that the drift region extends from a lower side of the plurality of well regions to the surface of the semiconductor layer through between the plurality of well regions.

According to the power semiconductor device fabricating method, the plurality of well regions may be formed to have a shape in which a width thereof increases as it goes to an inside of the semiconductor layer from the surface of the semiconductor layer and then decreases, and two well regions adjacent to each other from among the well regions may contact each other at a place where at least a width thereof is the largest within the semiconductor layer and may be spaced from each other on the surface of the semiconductor layer.

According to the power semiconductor device fabricating method, the forming of the plurality of well regions may include forming the plurality of well regions such that centers of seven well regions adjacent to each other from among the plurality of well regions are respectively disposed at a center and vertexes of a regular hexagon.

According to the power semiconductor device fabricating method, forming a plurality of well contact regions having the second conductivity type in the plurality of source regions and on the plurality of well regions, and forming a source electrode layer connected with the plurality of source regions and the plurality of well contact regions may be further provided.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Below, an embodiment of the present disclosure will be described in detail with reference to accompanying drawings. However, the present disclosure may be implemented in various different forms and should not be construed as being limited to embodiments to be disclosed below. Rather, these embodiments are provided as examples so that this disclosure will be thorough and complete and will fully convey the scope and spirit of the invention to one skilled in the art. Also, for convenience of description, sizes of at least some components or elements shown in drawings may be exaggerated or reduced. In drawings, the same sign refers to the same element.

Unless otherwise defined, all terms used herein are to be interpreted as commonly understood by one skilled in the art. In drawings, sizes of layers and regions are exaggerated for description, and are thus provided to describe normal structures of the present disclosure.

The same reference signs indicate the same components. When a first component such as a layer, a region, or a substrate is described as being on a second component, it may be understood as the first component is directly on the second component or a third component is interposed therebetween. On the other hand, when a first component is described as being "directly on" a second component, it is understood as any intermediate component is not interposed therebetween.

Figure 1:
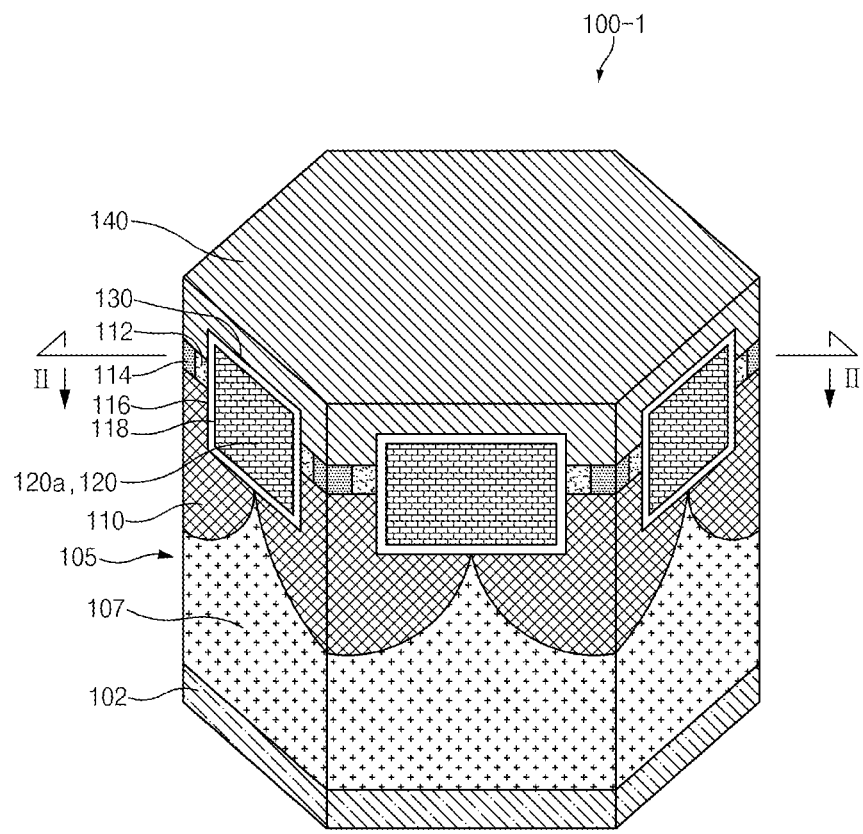
FIG. 1 is a schematic perspective view illustrating a power semiconductor device according to an embodiment of the present disclosure.
Figure 2:
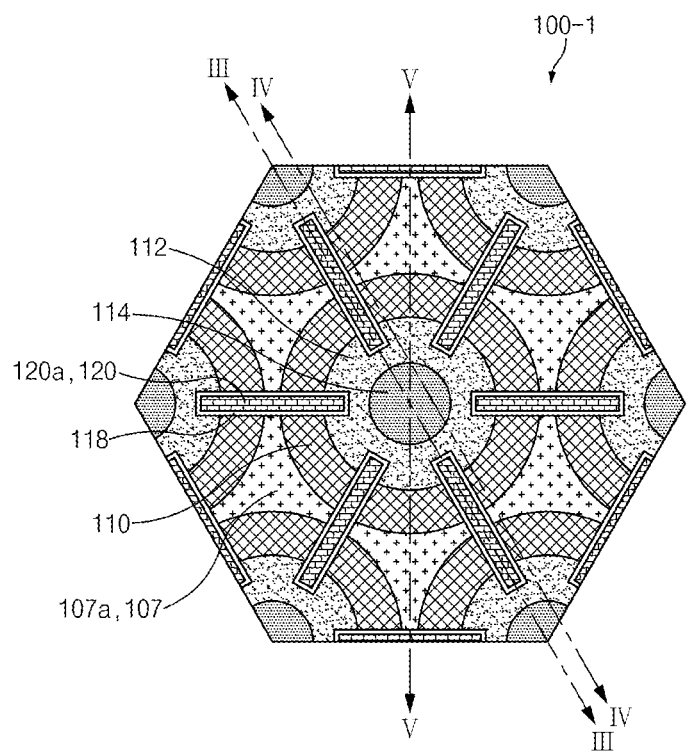
FIG. 2 is a plan view illustrating a power semiconductor device taken along line II-II of FIG. 1.
Figure 3:
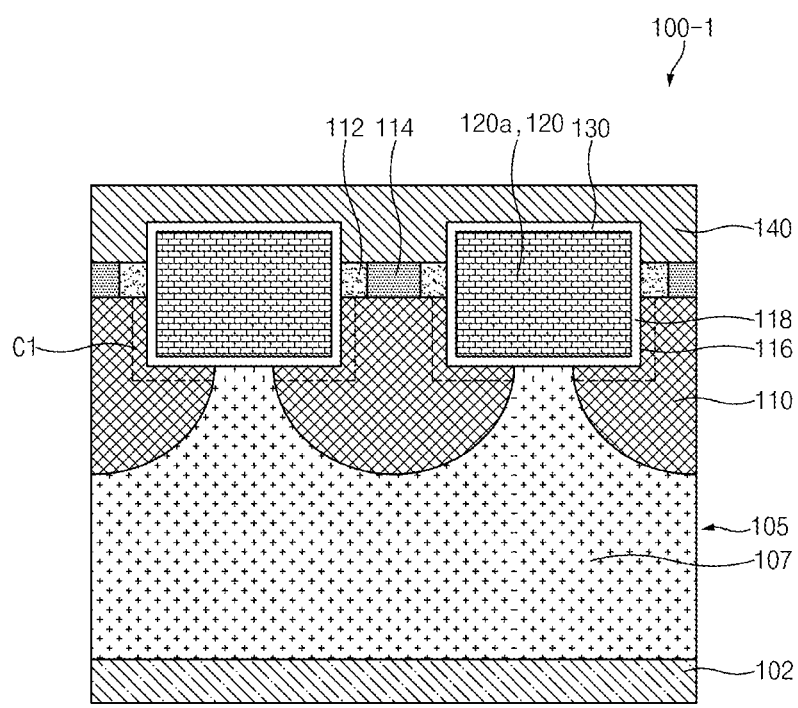
FIG. 3 is a cross-sectional view illustrating a power semiconductor device taken along line of FIG. 2.
Figure 4:
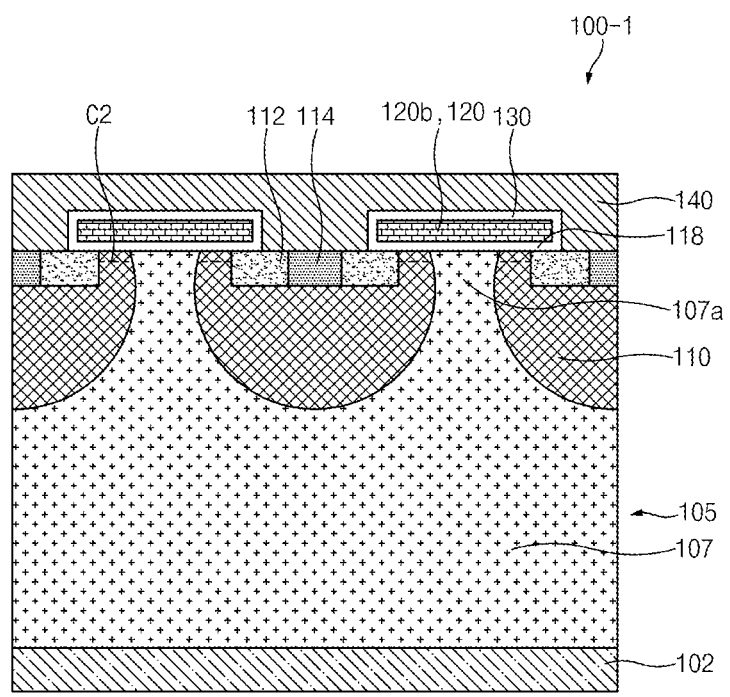
FIG. 4 is a cross-sectional view illustrating a power semiconductor device taken along line IV-IV of FIG. 2.
Figure 5:
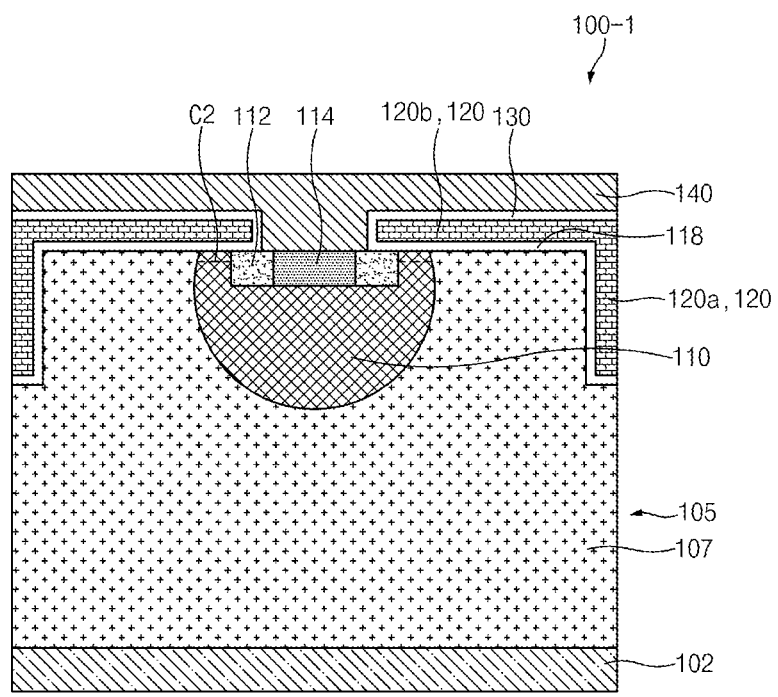
FIG. 5 is a cross-sectional view illustrating a power semiconductor device taken along line V-V of FIG. 2.

FIG. 1 is a schematic perspective view illustrating a power semiconductor device 100-1 according to an embodiment of the present disclosure, FIG. 2 is a plan view illustrating the power semiconductor device 100-1 taken along line II-II of FIG. 1, FIG. 3 is a cross-sectional view illustrating the power semiconductor device 100-1 taken along line of FIG. 2, FIG. 4 is a cross-sectional view illustrating the power semiconductor device 100-1 taken along line IV-IV of FIG. 2, and FIG. 5 is a cross-sectional view illustrating the power semiconductor device 100-1 taken along line V-V of FIG. 2.

Referring to FIGS. 1 to 5, the power semiconductor device 100-1 may at least include a semiconductor layer 105, a gate insulating layer 118, and a gate electrode layer 120. For example, the power semiconductor device 100-1 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be formed of silicon carbide (SiC). In more detail, the semiconductor layer 105 may include at least one epitaxial layer of silicon carbide.

Silicon carbide (SiC) may have a wider bandgap than silicon, thus maintaining stability even at a high temperature compared to silicon. In addition, because a breakdown electric field of the silicon carbide is much higher than that of the silicon, the silicon carbide may stably operate even at a high temperature. Accordingly, the power semiconductor device 100-1 using silicon carbide as the semiconductor layer 105 may have a high breakdown voltage compared to the case of using silicon and may provide an excellent heat emission (or release) characteristic and a stable operating characteristic at a high temperature.

In detail, the semiconductor layer 105 may include a plurality of well regions 110, a plurality of source regions 112, and a drift region 107.

The drift region 107 may have a first conductivity type and may be formed by implanting impurities of the first conductivity type into a portion of the semiconductor layer 105. For example, the drift region 107 may be formed by doping impurities of the first conductivity type in an epitaxial layer of silicon carbide. The drift region 107 may provide a vertical transport path of charges.

The well regions may be disposed in the semiconductor layer 105 so as to be spaced from each other and may have a second conductivity type. For example, the well regions 110 may be formed in the semiconductor layer 105 so as to be in contact with at least a portion of the drift region 107. In some embodiments, the well regions 110 may be formed by doping impurities of the second conductivity type opposite to the first conductivity type in the semiconductor layer 105 or the drift region 107.

The source regions 112 may be formed in the semiconductor layer 105 on the well regions 110 so as to be spaced from each other and may have the first conductivity type. For example, the source region 112 may be formed by doping impurities of the first conductivity type in the semiconductor layer 105 or the well region 110. The concentration of the first conductivity-type impurities doped in the source region 112 may be higher than that doped in the drift region 107.

A plurality of well contact regions 114 may be formed in the source regions 112 and on the well regions 110. For example, the plurality of well contact regions 114 may be formed on the well regions 110 so as to be connected with the well regions 110 through the source regions 112. The well contact regions 114 may be formed to have the second conductivity type.

The well contact regions 114 may be connected with a source electrode layer 140, and may be doped with second conductivity-type impurities of a higher concentration than the well regions 110 for the purpose of reducing a contact resistance when connected with the source electrode layer 140.

In some embodiments, the well contact regions 114 may be formed in a recess groove being in contact with the well regions 110. In this case, the source electrode layer 140 may be formed to fill the recess groove and may be connected with the well contact region 114.

In addition, a drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a portion of the semiconductor layer 105 or may be understood as a substrate independent of the semiconductor layer 105. In addition, in some embodiments, the drain region 102 may be implemented with a substrate of silicon carbide having the first conductivity type, and the drift region 107 may be formed on the drain region 102 by using one or more epitaxial layers.

In some embodiments, the drift region 107 may be formed in the semiconductor layer 105 so as to extend to a surface of the semiconductor layer 105 through between the well regions 110 from the lower side of the well regions 110. For example, the drift region 107 may include protrusions 107a extended to the surface of the semiconductor layer 105 between the well regions 110.

A plurality of trenches 116 may be formed to be recessed into the semiconductor layer 105 from the surface of the semiconductor layer 105 as much as a given depth. For example, each of the trenches 116 may be formed to connect two source regions adjacent to each other from among the source regions 112. In detail, each trench 116 may be formed in a line type in which one source region 112 is connected with an adjacent source region 112 across one well regions 110 surrounding the one source region 112, the protrusion 107a of the drift region 107, and an adjacent well region 110.

For example, the trenches 116 may be formed to penetrate portions of the source regions 112 and to be recessed to a given depth of the well regions 110 and the protrusions 107a of the drift region 107. Accordingly, opposite corners (or edges) of the trenches 116 may be surrounded by the well regions 110.

The gate insulating layer 118 may be formed on inner walls of the trenches 116 and at least a portion of the semiconductor layer 105. For example, the gate insulating layer 118 may be formed on the inner walls of the trenches 116 and the surface of the semiconductor layer 105.

For example, the gate insulating layer 118 may include an insulating material such as silicon oxide, silicon carbide oxide, silicon nitride, hafnium oxide, zirconium oxide, or aluminum oxide, or may include a stacked structure thereof.

The gate electrode layer 120 may be formed on the gate insulating layer 118. For example, the gate electrode layer 120 may include a first portion 120a burying the trenches 116 and a second portion 120b on the surface of the semiconductor layer 105. For example, the first portion 120a of the gate electrode layer 120 may have a trench-type gate structure, and the second portion 120b may have a planar-type gate structure. Accordingly, the gate electrode layer 120 may have a hybrid-type structure including both the trench-type gate structure and the planar-type gate structure.

For example, the second portion 120b of the gate electrode layer 120 may be formed on the protrusions 107a of the drift region 107 and the well regions 110. In detail, the second portion 120b of the gate electrode layer 120 may be formed on 1) the protrusions 107a of the drift region 107, which are exposed on the surface of the semiconductor layer 105, 2) surfaces of the well regions 110, and 3) surfaces of portions of peripheries of the source regions 112. The well contact regions 114 and the remaining portions of the source regions 112 may be disposed on the outside of the gate electrode layer 120 and may be exposed from the gate electrode layer 120.

For example, the gate electrode layer 120 may include an appropriate conductive material such as polysilicon, metal, metal nitride, or metal silicide, or may include a stacked structure thereof.

An interlayer insulating layer 130 may be formed on the gate electrode layer 120. For example, the interlayer insulating layer 130 may include an appropriate insulating material such as an oxide layer or a nitride layer, or may include a stacked structure thereof.

The source electrode layer 140 may be formed on the interlayer insulating layer 130. In addition, the source electrode layer 140 may be connected in common with the source regions 112 and the well contact regions 114. For example, the source electrode layer 140 may be connected with the source region 112 and the well contact region 114 through a portion exposed by the gate electrode layer 120 and may be disposed to further extend onto the gate electrode layer 120. For example, the source electrode layer 140 may be formed of an appropriate conductive material, metal, or the like.

A first channel region C1 may be formed in the semiconductor layer 105 along the trench 116 corresponding to the first portion 120a of the gate electrode layer 120 so as to be connected with the source regions 112 and the drift region 107. For example, the first channel region C1 may be formed in the semiconductor layer 105 along side walls of the trench 116 so as to be connected between the drift region 107 under the trench 116, for example, the protrusion 107a of the drift region 107 and the source regions 112 contacting the trench 116. Accordingly, the first channel region C1 may have a trench-type channel structure.

A second channel region C2 may be formed in the semiconductor layer 105 under the second portion 120b of the gate electrode layer 120 so as to be in contact with the source regions 112. For example, the second channel region C2 may be formed on the semiconductor layer 105 between the protrusion 107a of the drift region 107 and the source regions 112. The second channel region C2 may be formed to cover surfaces of the well regions 110. Accordingly, the second channel region C2 may have a planar-type channel structure.

For example, the first channel region C1 and the second channel region C2 may have the second conductivity type such that an inversion channel is formed. Because the first channel region C1 and the second channel region C2 have a doping type opposite to that of the source region 112 and the drift region 107, the first channel region C1 and the second channel region C2 may form a diode junction with the source region 112 and the drift region 107.

Accordingly, the first channel region C1 and the second channel region C2 may not permit charges to move in a normal situation; however, when an operating voltage is applied to the gate electrode layer 120, the inversion channel may be formed therein such that the movement of charges is permitted.

For example, the first channel region C1 and the second channel region C2 may be portions of the well regions 110. In detail, the first channel region C1 may be portions of the well regions 110 adjacent to a lower surface of the first portion 120a of the gate electrode layer 120, and the second channel region C2 may be portions of the well regions 110 adjacent to a lower surface of the second portion 120b of the gate electrode layer 120.

In this case, the first channel region C1 and the second channel region C2 may be integrally formed with the well regions 110 or may be formed to be continuously connected with the well regions 110. A doping concentration of the second conductivity-type impurities of the first channel region C1 and the second channel region C2 may be the same as that of the remaining portion of the well region 110 or may be different therefrom for the purpose of the adjustment of a threshold voltage.

In some embodiments, distances between three well regions 110 adjacent to each other from among the well regions 110 may be the same as each other. In addition, distances between three source regions 112 adjacent to each other from among the source regions 112 may be the same as each other. For example, centers of three adjacent well regions 110 may be respectively disposed at vertexes of a regular triangle, and centers of three adjacent source regions 112 on the three well regions 110 may also be respectively disposed at the vertexes of the same regular triangle. For example, the well regions 110 and the source regions 112 may be understood as indicating three triangles disposed in FIG. 2.

In some embodiments, centers of seven adjacent well regions 110 of the well regions 110 may be respectively disposed at a center and vertexes of a regular hexagon. In addition, centers of seven source regions 112 being on the seven adjacent well regions 110 from among the source regions 112 may be respectively disposed at the center and vertexes of the regular hexagon. For example, FIGS. 1 to 5 may be understood as illustrating 7 well regions 110 and 7 source regions 112 described above.

In this structure, the well regions 110 and the source regions 112 may be disposed to be similar to a planar arrangement structure in a hexagonal closed packed arrangement structure. In addition, a distance between two adjacent well regions 110 of the well regions 110 may be uniform, and a distance between two adjacent source regions 112 of the source regions 112 may be uniform.

In this structure, the trenches 116 may be disposed to form portions of lines each connecting two adjacent to each other from among the center and vertexes of the regular hexagon such that seven adjacent source regions 112 are connected. In detail, in FIG. 2, the trenches 116 may include 6 lines connecting 6 source regions 112 disposed at the vertexes with one source region 112 disposed at the center of the regular hexagon, and 6 lines each connecting two adjacent source regions from among 6 source regions 112 disposed at the vertexes.

In some embodiments, the well regions 110 may have a shape in which a width thereof increases as it goes to the inside of the semiconductor layer 105 from the surface of the semiconductor layer 105 and then decreases. For example, the well region 110 may be a portion of a spherical shape, and a cross section of the well region 110 may be circular.

In addition, the well contact region 114 may be formed in the shape of a circle in a plan view. For example, in a plan view, the circular well contact region 114 may be formed in the circular well region 110. Lower surfaces of the well contact regions 114 may be connected with the well regions 110. In a plan view, the source region 112 may be formed in the shape of a doughnut surrounding the well contact region 114. The above shape that is viewed from above the surface of the semiconductor layer 105 may extend to a given depth from the surface of the semiconductor layer 105.

In the power semiconductor device 100-1 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-1 is an N-type MOSFET, the drift region 107 may be an N− region, the source region 112 and the drain region 102 may be N+ regions, the well region 110, the first channel region C1, and the second channel region C2 may be P− regions, and the well contact region 114 may be a P+ region.

According to the power semiconductor device 100-1, a depth of the well regions 110 may be deeper than that of the trenches 116 and the gate electrode layer 120. As such, a trench bottom corner of the first portion 120a of the gate electrode layer 120 may be surrounded by the well region 110. This structure may alleviate the concentration of the electric field at the trench bottom corner in the trench-type gate structure.

In an operation of the power semiconductor device 100-1, a current may generally flow in a vertical direction from the drain region 102 along the drift region 107, and may then flow to the source region 112 through the first channel region C1 and the second channel region C2.

The power semiconductor device 100-1 may have a hybrid structure including both the trench-type gate structure and the planar-type gate structure. In addition, the power semiconductor device 100-1 may have a regular hexagon arrangement structure and may provide the high degree of integration with the high channel density by combining the trench-type gate structure and the planar-type gate structure. In addition, compared to the case where only a planar-type structure is provided, the power semiconductor device 100-1 may maintain the degree of integration through the addition of the trench-type structure and may improve the channel mobility.

Figure 6:
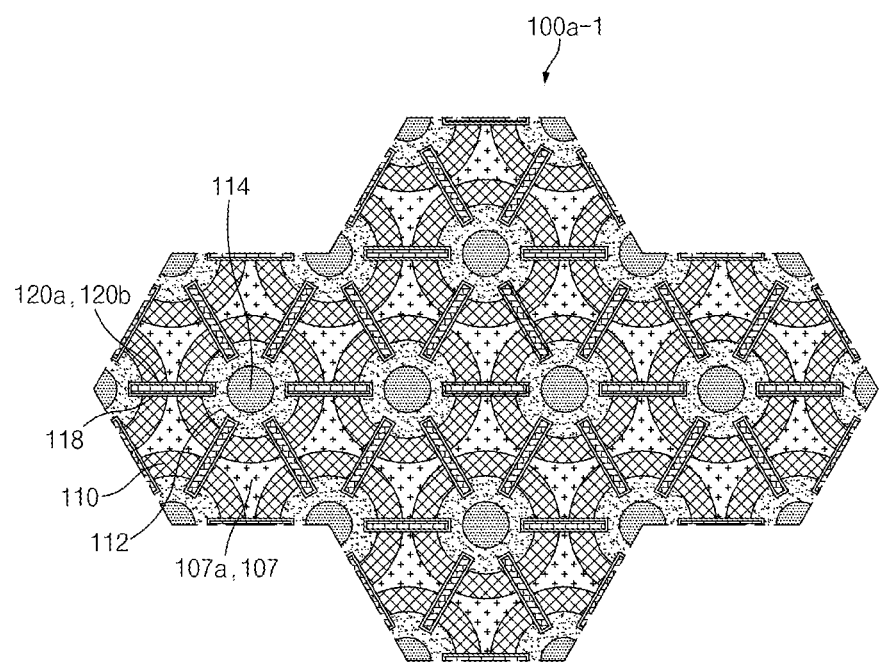
FIG. 6 is a plan view illustrating a power semiconductor device according to another embodiment of the present disclosure.

FIG. 6 is a cross-sectional view illustrating a power semiconductor device 100a-1 according to another embodiment of the present disclosure.

Referring to FIG. 6, the power semiconductor device 100a-1 shows a portion of a structure in which a plurality of power semiconductor device 100-1 (refer to FIGS. 1 to 5) are arranged.

As the hexagonal closed packed arrangement structure is repeated, the power semiconductor device 100a-1 may have the high degree of integration.

Figure 7:
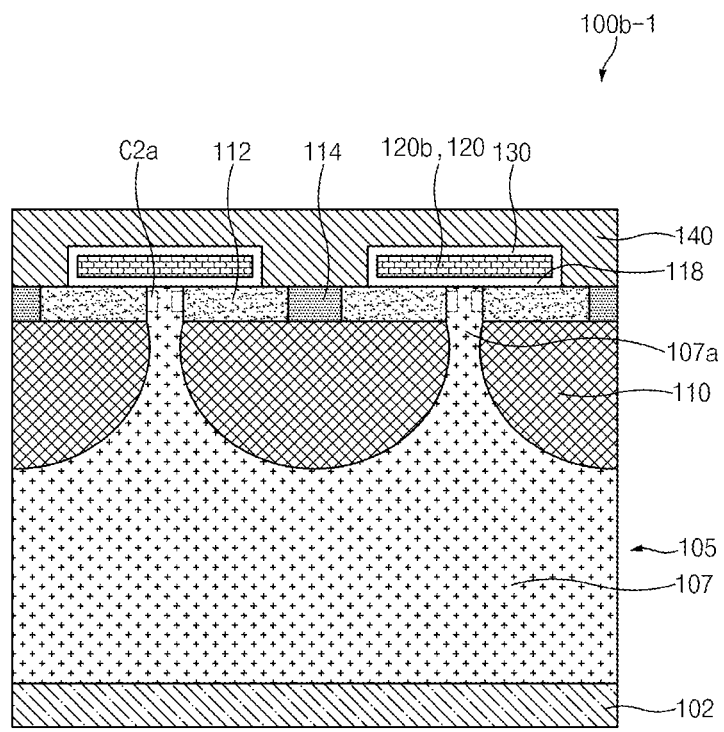
FIGS. 7 and 8 are cross-sectional views illustrating a power semiconductor device according to another embodiment of the present disclosure.
Figure 8:
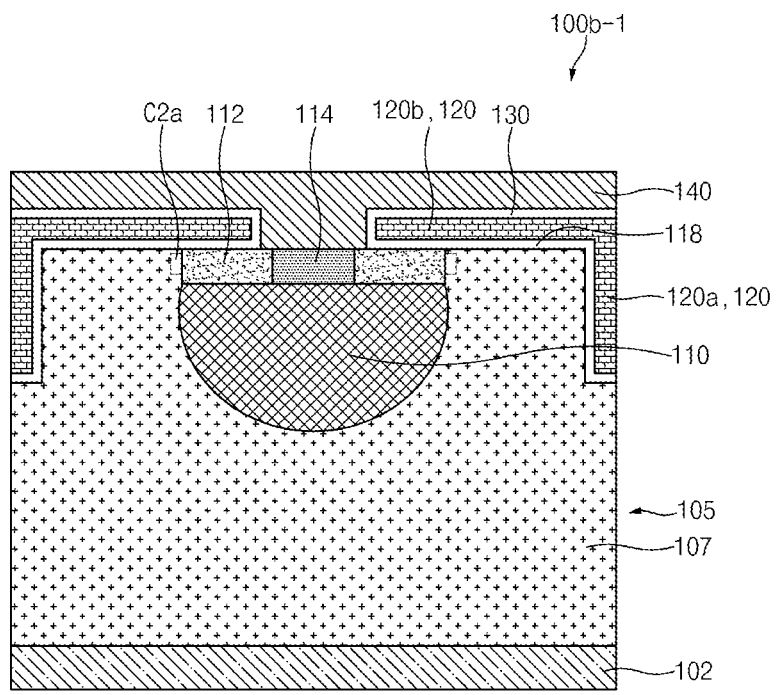

FIGS. 7 and 8 are cross-sectional views illustrating a power semiconductor device 100b-1 according to another embodiment of the present disclosure. The power semiconductor device 100b-1 may be implemented by modifying a partial configuration of the power semiconductor device 100-1 of FIGS. 1 to 5, and thus, additional description will be omitted to avoid redundancy because they may be referred to each other.

Referring to FIGS. 7 and 8, in the power semiconductor device 100b-1, a second channel region C2a may be formed in the semiconductor layer 105 between the drift region 107 and the source region 112. For example, the second channel region C2a may be formed in the semiconductor layer 105 between the protrusion 107a of the drift region 107 and the source region 112. The second channel region C2a may have the first conductivity type such that an accumulation channel is formed.

For example, the second channel region C2a may have the same doping type as the source region 112 and the drift region 107. In this case, the source region 112, the second channel region C2a, and the drift region 107 may be normally electrically connected in structure. However, in the structure of the semiconductor layer 105 of silicon carbide, a potential barrier is formed while a band of the second channel region C2a is upwardly bent due to the influence of negative charges generated by the formation of carbon clusters in the gate insulating layer 118. As such, there may be formed the accumulation channel that permits charges or current flow in the second channel region C2a when an operating voltage is applied to the gate electrode layer 120.

Accordingly, a threshold voltage to be applied to the gate electrode layer 120 to form the accumulation channel in the second channel region C2a may be considerably lower than a threshold voltage to be applied to the gate electrode layer 120 to form a normal inversion channel.

In some embodiments, the second channel region C2a may be a portion of the drift region 107. In more detail, the second channel region C2a may be a portion of the protrusion 107a of the drift region 107. For example, the second channel region C2a may be integrally formed with the drift region 107. As such, in the power semiconductor device 100b-1, the source regions 112 may be in direct contact with the drift region 107, for example, the protrusion 107a, and the second channel region C2a may be restricted to a portion of the drift region 107, at which the direct contact is made.

For example, a doping concentration of the first conductivity-type impurities of the second channel region C2a may be the same as that of the remaining portion of the drift region 107 or may be different therefrom for the purpose of the adjustment of a threshold voltage.

In some embodiments, the well region 110 may be formed under the source regions 112 so as to protrude toward the protrusion 107a of the drift region 107 farther than the source regions 112. In this case, the second channel region C2a may be formed in the semiconductor layer 105 on the protruding portion of the well region 110. For example, the protrusion 107a of the drift region 107 may further extend to a groove portion between the well region 110 and the gate electrode layer 120, and the second channel region C2a may be formed at the protruding portion. The above structure may allow the second channel region C2a to be restricted between the second portion 120b of the gate electrode layer 120 and the well region 110.

In the power semiconductor device 100b-1, the first channel region C1 may be provided as an inversion channel like the power semiconductor device 100-1 of FIGS. 1 to 5.

Figure 9:
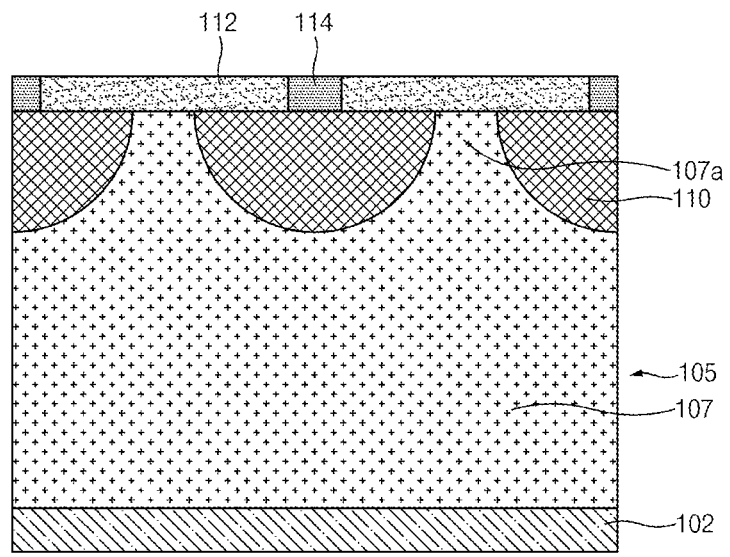
FIGS. 9, 10, 11 and 13 are cross-sectional views illustrating a method of fabricating a power semiconductor device according to an embodiment of the present disclosure.
Figure 10:
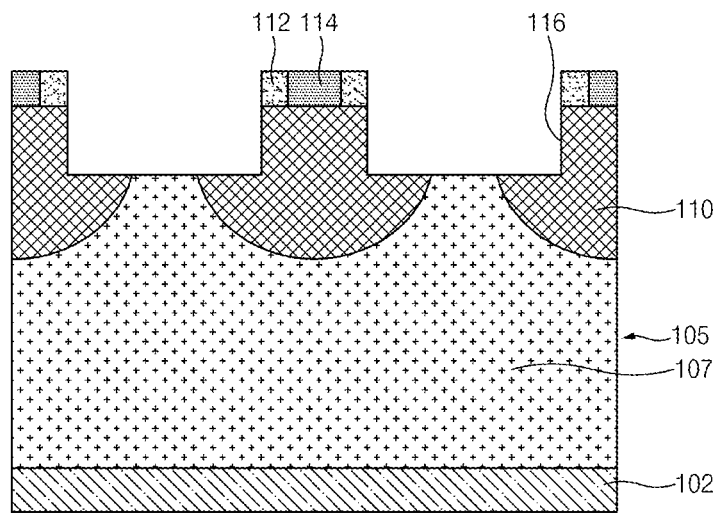
Figure 11:
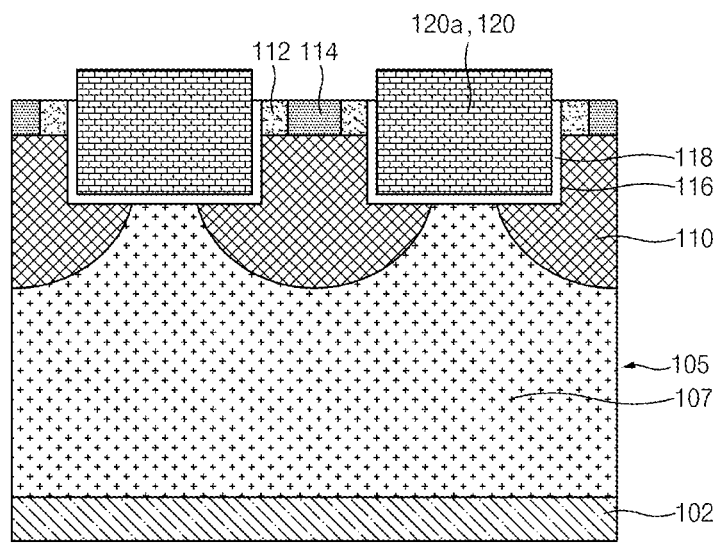
Figure 12:
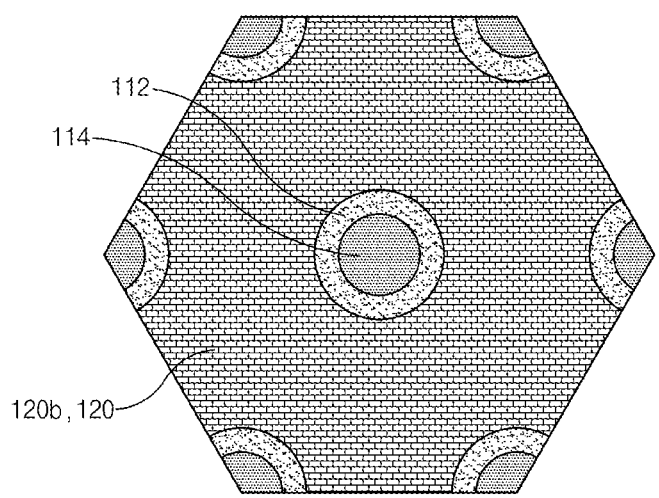
FIG. 12 is a plan view illustrating a power semiconductor device of FIG. 11.

FIGS. 9 to 11 and 13 are cross-sectional views illustrating a method of fabricating the power semiconductor device 100-1 according to an embodiment of the present disclosure, and FIG. 12 is a plan view of FIG. 11.

Referring to FIG. 9, the drift region 107 having the first conductivity type may be formed in the semiconductor layer 105 of silicon carbide (SiC). For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well regions 110 having the second conductivity type may be formed in the semiconductor layer 105 so as to be in contact with the drift region 107. For example, the forming of the well regions 110 may include implanting impurities of the second conductivity type into the semiconductor layer 105. The well regions 110 may be formed with a given depth substantially from the surface of the semiconductor layer 105.

For example, the well regions 110 may be formed in the semiconductor layer 105 such that the drift region 107 includes the protrusions 107a, at least portions of which are surrounded by the well regions 110. In more detail, the well regions 110 may be formed by doping impurities of a conductivity type opposite to that of the drift region 107 in the drift region 107.

The source regions 112 having the first conductivity type may be formed in the well regions 110 or on the well regions 110. For example, the source regions 112 may be formed by implanting impurities of the first conductivity type into the well regions 110 and the drift region 107. The source regions 112 may be formed in the well region 110 with a given depth substantially from the surface of the semiconductor layer 105.

The well contact regions 114 may be formed by implanting second conductivity-type impurities into the well regions 110 or into the source regions 112. For example, the well contact regions 114 may be formed to have a circular shape in a plan view.

In a modified example of this embodiment, an order in which the well regions 110, the well contact regions 114, and the source regions 112 are doped with impurities may be changed arbitrarily.

In the above fabricating method, the impurity implantation or the impurity doping may be performed such that the impurities are mixed when the impurities are implanted into the semiconductor layer 105 or an epitaxial layer is formed. However, the ion implantation method using a mask pattern may be used to implant impurities into a selective region.

Optionally, a heat treatment process for activating or diffusing the impurities may be performed after the ion implantation.

Referring to FIG. 10, a plurality of trenches 116 may be formed to be recessed into the semiconductor layer 105 from the surface of the semiconductor layer 105 as much as a given depth.

For example, the trenches 116 may be formed to penetrate portions of the source regions 112 and to be recessed to a given depth of the well regions 110 and the protrusions 107a of the drift region 107.

For example, the trenches 116 may be formed by forming a photo mask by using photo lithography and then etching the semiconductor layer 105 by using the photo mask as an etching protection layer.

Referring to FIGS. 11 and 12, the gate insulating layer 118 may be formed on the inner walls of the trenches 116 and the surface of the semiconductor layer 105. For example, the gate insulating layer 118 may be formed by oxidizing the semiconductor layer 105 to form an oxide or by depositing an insulating material such as oxide or nitride on the semiconductor layer 105.

Afterwards, the gate electrode layer 120 that includes the first portion 120a burying the trenches 116 and the second portion 120b on the surface of the semiconductor layer 105 may be formed on the gate insulating layer 118. For example, the gate electrode layer 120 may be formed by forming a conductive layer on the gate insulating layer 118 and then patterning the conductive layer. The gate electrode layer 120 may be formed by doping impurities in polysilicon or may be formed to include a conductive metal or metal silicide.

A patterning process may be performed by using the photo lithography and etching processes. The photo lithography process may include a process of forming a photoresist pattern as a mask layer by using a photo process and a development process, and the etching process may include a process of selectively etching an underlying structure by using the photoresist pattern.

Figure 13:
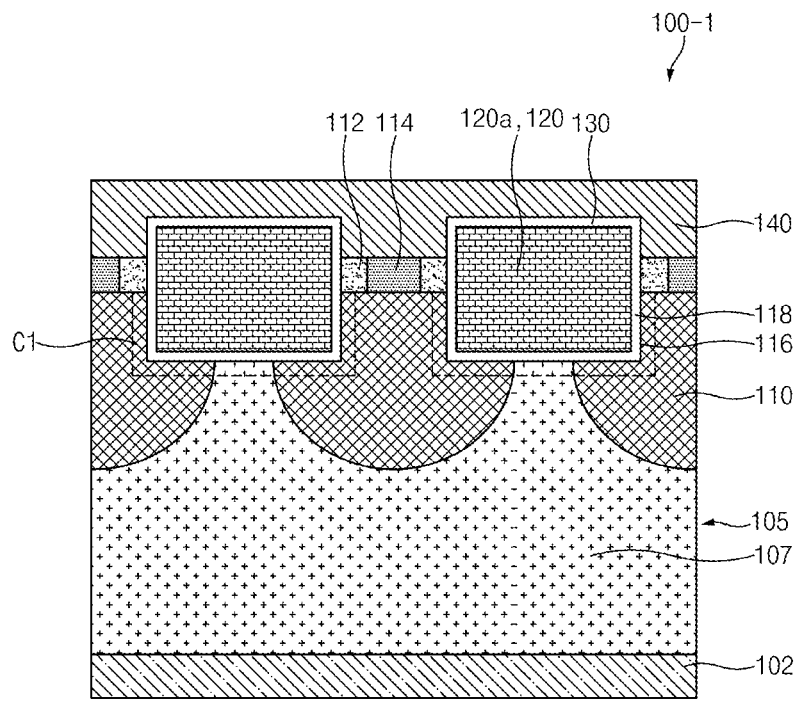

Referring to FIG. 13, the interlayer insulating layer 130 may be formed on the gate electrode layer 120.

Afterwards, the source electrode layer 140 may be foiled on the interlayer insulating layer 130 so as to be connected with the source regions 112 and the well contact regions 114. For example, the source electrode layer 140 may be formed by forming a conductive layer, for example, a metal layer on the interlayer insulating layer 130 and patterning the conductive layer.

Figure 14:
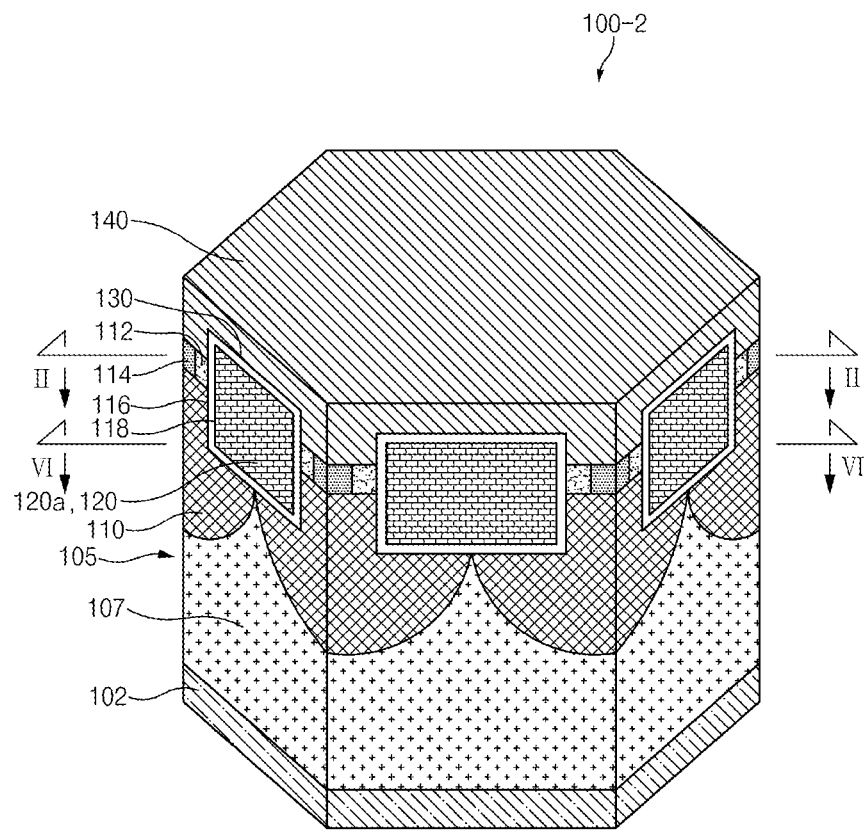
FIG. 14 is a schematic perspective view illustrating a power semiconductor device according to an embodiment of the present disclosure.
Figure 15:
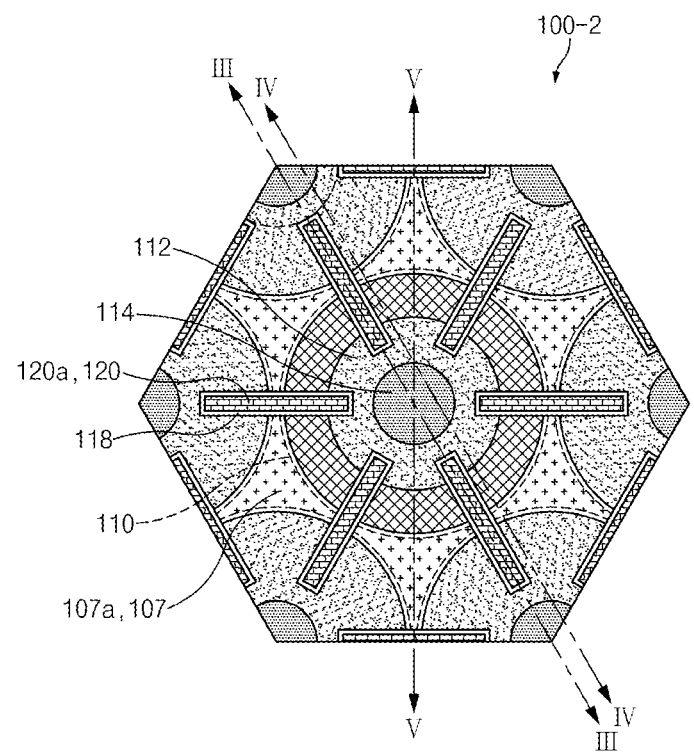
FIG. 15 is a plan view illustrating a power semiconductor device taken along line II-II of FIG. 14.
Figure 16:
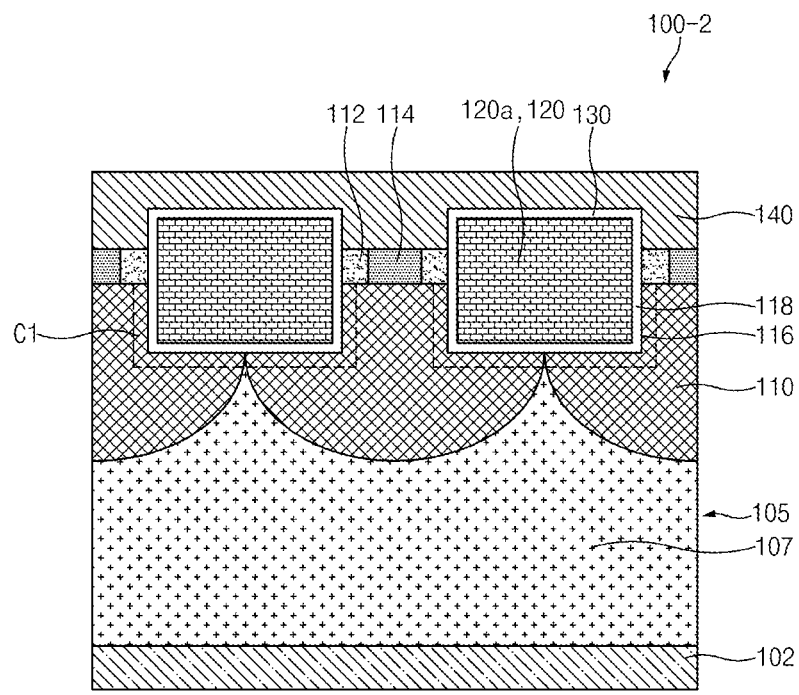
FIG. 16 is a cross-sectional view illustrating a power semiconductor device taken along line of FIG. 15.
Figure 17:
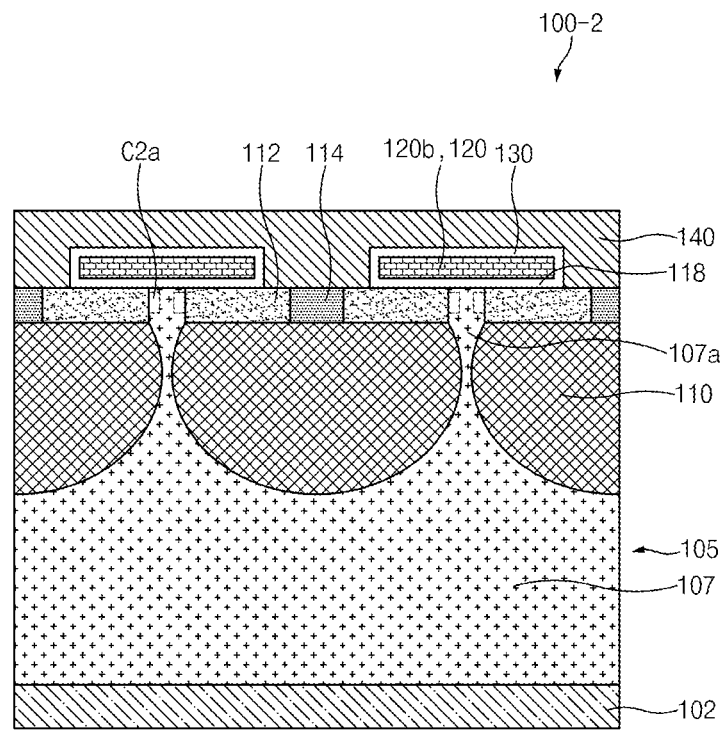
FIG. 17 is a cross-sectional view illustrating a power semiconductor device taken along line IV-IV of FIG. 15.
Figure 18:
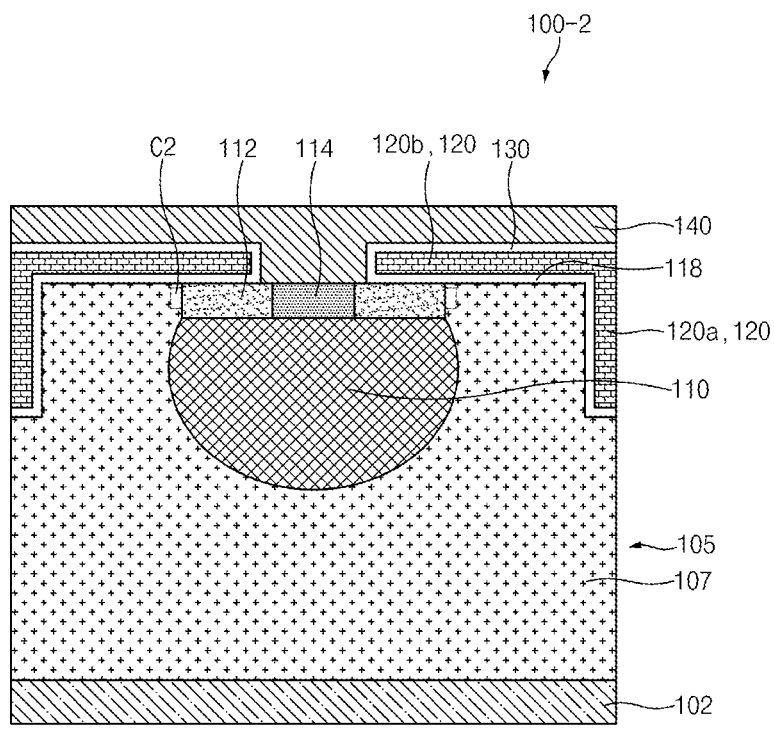
FIG. 18 is a cross-sectional view illustrating a power semiconductor device taken along line V-V of FIG. 15.
Figure 19:
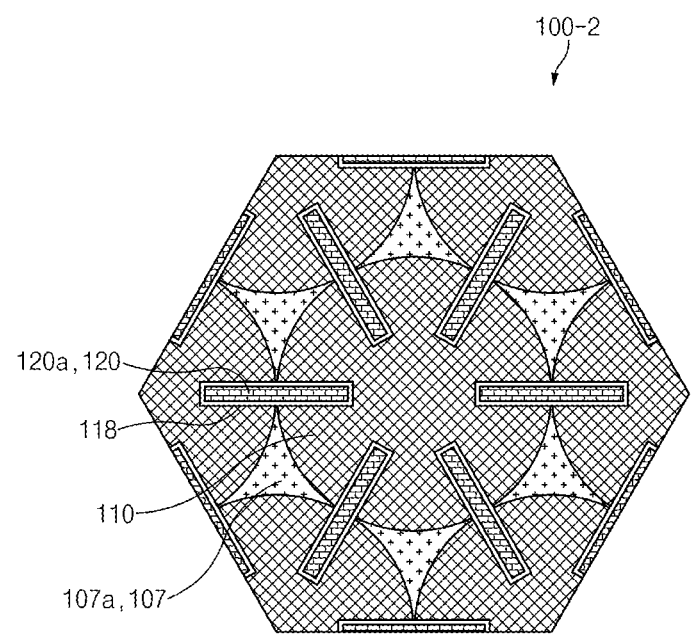
FIG. 19 is a plan view illustrating a power semiconductor device taken along line VI-VI of FIG. 14.

FIG. 14 is a schematic perspective view illustrating a power semiconductor device 100-2 according to an embodiment of the present disclosure, FIG. 15 is a plan view illustrating the power semiconductor device 100-2 taken along line II-II of FIG. 14, FIG. 16 is a cross-sectional view illustrating the power semiconductor device 100-2 taken along line of FIG. 15, FIG. 17 is a cross-sectional view illustrating the power semiconductor device 100-2 taken along line IV-IV of FIG. 15, and FIG. 18 is a cross-sectional view illustrating the power semiconductor device 100-2 taken along line V-V of FIG. 15, and FIG. 19 is a plan view illustrating the power semiconductor device 100-2 taken along line VI-VI of FIG. 14.

Referring to FIGS. 14 to 19, the power semiconductor device 100-2 may at least include the semiconductor layer 105, the gate insulating layer 118, and the gate electrode layer 120. For example, the power semiconductor device 100-2 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be foiled of silicon carbide (SiC). In more detail, the semiconductor layer 105 may include at least one epitaxial layer of silicon carbide.

Silicon carbide (SiC) may have a wider bandgap than silicon, thus maintaining stability even at a high temperature compared to silicon. In addition, because a breakdown electric field of the silicon carbide is much higher than that of the silicon, the silicon carbide may stably operate even at a high temperature. Accordingly, the power semiconductor device 100-2 using silicon carbide as the semiconductor layer 105 may have a high breakdown voltage compared to the case of using silicon and may provide an excellent heat emission (or release) characteristic and a stable operating characteristic at a high temperature.

In detail, the semiconductor layer 105 may include the plurality of well regions 110, the plurality of source regions 112, and the drift region 107.

The drift region 107 may have the first conductivity type and may be formed by implanting impurities of the first conductivity type into a portion of the semiconductor layer 105. For example, the drift region 107 may be formed by doping impurities of the first conductivity type in an epitaxial layer of silicon carbide. The drift region 107 may provide a vertical transport path of charges.

The well regions 110 may be formed in the semiconductor layer 105 and may have the second conductivity type. For example, the well regions 110 may be formed in the semiconductor layer 105 so as to be in contact with at least a portion of the drift region 107. In some embodiments, the well regions 110 may be formed by doping impurities of the second conductivity type opposite to the first conductivity type in the semiconductor layer 105 or the drift region 107.

The source regions 112 may be formed in the semiconductor layer 105 on the well regions 110 and may have the first conductivity type. For example, the source region 112 may be formed by doping impurities of the first conductivity type in the semiconductor layer 105 or the well region 110. The concentration of the first conductivity-type impurities doped in the source region 112 may be higher than that doped in the drift region 107.

The plurality of well contact regions 114 may be formed in the source regions 112 and on the well regions 110. For example, the plurality of well contact regions 114 may be formed on the well regions 110 so as to be connected with the well regions 110 through the source regions 112. The well contact regions 114 may be formed to have the second conductivity type.

The well contact regions 114 may be connected with the source electrode layer 140, and may be doped with second conductivity-type impurities of a higher concentration than the well regions 110 for the purpose of reducing a contact resistance when connected with the source electrode layer 140.

In some embodiments, the well contact regions 114 may be formed in a recess groove being in contact with the well regions 110. In this case, the source electrode layer 140 may be formed to fill the recess groove and may be connected with the well contact region 114.

In addition, the drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a portion of the semiconductor layer 105 or may be understood as a substrate independent of the semiconductor layer 105. In addition, in some embodiments, the drain region 102 may be implemented with a substrate of silicon carbide having the first conductivity type, and the drift region 107 may be formed on the drain region 102 by using one or more epitaxial layers.

The well regions 110 may be formed in the semiconductor layer 105 such that two adjacent well regions at least partially contact each other. In addition, the well regions 110 may have a shape in which a width thereof increases as it goes to the inside of the semiconductor layer 105 from the surface of the semiconductor layer 105 and then decreases. In detail, two well regions adjacent to each other of the well regions 110 may contact each other, as illustrated in FIG. 19, at a place where at least a width thereof is the largest and may be spaced from each other on the surface of the semiconductor layer 105 as illustrated in FIG. 15.

In some embodiments, the drift region 107 may be formed in the semiconductor layer 105 so as to be connected from the lower side of the well regions 110 to the surface of the semiconductor layer 105 through between the well regions 110. For example, the drift region 107 may include protrusions 107a extended to the surface of the semiconductor layer 105 between the well regions 110.

The plurality of trenches 116 may be formed to be recessed into the semiconductor layer 105 from the surface of the semiconductor layer 105 as much as a given depth. For example, the trenches 116 may be formed to connect two source regions 112 adjacent to each other from the source regions 112 across a place where two well regions adjacent to each other from among the well regions 110 contact each other. In detail, each trench 116 may be formed in a line type in which one source region 112 is connected with an adjacent source region 112 across one well regions 110 surrounding the one source region 112, the protrusion 107a of the drift region 107, and an adjacent well region 110.

For example, the trenches 116 may be formed to penetrate portions of the source regions 112 and to be recessed to a given depth of the well regions 110 and the protrusions 107a of the drift region 107. Accordingly, opposite corners (or edges) of the trenches 116 may be surrounded by the well regions 110.

In addition, when viewed from the cross section of the trenches 116 taken along an extending direction thereof, bottom surfaces of the trenches 116 may be surrounded by the well regions 110 on the whole. For example, two well regions adjacent to each other from among the well regions 110 may be formed to contact each other on the bottom surfaces of the trenches 116 or around the bottom surfaces thereof, and thus, the bottom surfaces of the trenches 116 may be surrounded by the well regions 110 at least on a line according to the extending direction.

The gate insulating layer 118 may be formed on inner walls of the trenches 116 and at least a portion of the semiconductor layer 105. For example, the gate insulating layer 118 may be formed on the inner walls of the trenches 116 and the surface of the semiconductor layer 105.

For example, the gate insulating layer 118 may include an insulating material such as silicon oxide, silicon carbide oxide, silicon nitride, hafnium oxide, zirconium oxide, or aluminum oxide, or may include a stacked structure thereof.

The gate electrode layer 120 may be formed on the gate insulating layer 118. For example, the gate electrode layer 120 may include the first portion 120a burying the trenches 116 and the second portion 120b on the surface of the semiconductor layer 105. For example, the first portion 120a of the gate electrode layer 120 may have a trench-type gate structure, and the second portion 120b may have a planar-type gate structure. Accordingly, the gate electrode layer 120 may have a hybrid-type structure including both the trench-type gate structure and the planar-type gate structure.

For example, the second portion 120b of the gate electrode layer 120 may be formed on the protrusions 107a of the drift region 107 and the source regions 112. In detail, the second portion 120b of the gate electrode layer 120 may be formed on 1) the protrusions 107a of the drift region 107, which are exposed on the surface of the semiconductor layer 105, and 2) surfaces of portions of peripheries of the source regions 112. The well contact regions 114 and the remaining portions of the source regions 112 may be disposed on the outside of the gate electrode layer 120 and may be exposed from the gate electrode layer 120.

Trench bottom corner portions of the first portion 120a of the gate electrode layer 120 may be surrounded by the well regions 110. In addition, when viewed from the cross section of the first portion 120a taken along an extending direction thereof, a bottom surface of the first portion 120a may be surrounded by the well regions 110 on the whole. For example, portions of the well regions 110, which surround the bottom surface of the first portion 120a, may be the thinnest at a central portion of the bottom surface of the first portion 120a and may be gradually become thicker as it goes toward a corner portion thereof.

An example in which two adjacent well regions 110 contact each other at the center of the bottom surface of the trench 116 is illustrated in FIG. 16, but the two adjacent well regions 110 may further overlap each other around the center of the bottom surface of the trench 116. In this case, in FIG. 18, the well regions 110 may be further disposed under the bottom surface of the trench 116.

For example, the gate electrode layer 120 may include an appropriate conductive material such as polysilicon, metal, metal nitride, or metal silicide, or may include a stacked structure thereof.

An interlayer insulating layer 130 may be formed on the gate electrode layer 120. For example, the interlayer insulating layer 130 may include an appropriate insulating material such as an oxide layer or a nitride layer, or may include a stacked structure thereof.

The source electrode layer 140 may be formed on the interlayer insulating layer 130. In addition, the source electrode layer 140 may be connected in common with the source regions 112 and the well contact regions 114. For example, the source electrode layer 140 may be connected with the source region 112 and the well contact region 114 through a portion exposed by the gate electrode layer 120 and may be disposed to further extend onto the gate electrode layer 120. For example, the source electrode layer 140 may be formed of an appropriate conductive material, metal, or the like.

As illustrated in FIG. 17, at least edge portions of the source regions 112 on the well regions 110 may be exposed from the well regions 110. As such, the edge portions of the source regions 112 may be in contact with the protrusion of the drift region 107.

The first channel region C1 may be restricted to the semiconductor layer 105 along the trench 116 corresponding to the first portion 120a of the gate electrode layer 120. For example, the first channel region C1 may be formed in the semiconductor layer 105 along the trench 116 so as to be connected with the source regions 112 and the drift region 107.

In detail, the first channel region C1 may be formed in the semiconductor layer 105 along side walls of the trench 116 so as to be connected between the drift region 107 under the trench 116 or on a side surface of the trench 116, for example, the protrusion 107a of the drift region 107 and the source regions 112 contacting the trench 116. Accordingly, the first channel region C1 may have a trench-type channel structure.

For example, the first channel region C1 may have the second conductivity type such that an inversion channel is formed. Because the first channel region C1 has a doping type opposite to that of the source region 112 and the drift region 107, the first channel region C1 may form a diode junction with the source region 112 and the drift region 107.

Accordingly, the first channel region C1 may not permit charges to move in a normal situation; however, when an operating voltage is applied to the gate electrode layer 120, an inversion channel may be formed therein such that the movement of charges is permitted.

In some embodiments, the first channel region C1 may correspond to portions of the well regions 110. In more detail, the first channel region C1 may correspond to portions of the well regions 110, which are adjacent to a lower surface of the first portion 120a of the gate electrode layer 120.

In this case, the first channel region C1 may be integrally formed with the well regions 110 or may be formed to be continuously connected therewith. A doping concentration of the second conductivity-type impurities of the first channel region C1 may be the same as that of the remaining portion of the well region 110 or may be different therefrom for the purpose of the adjustment of a threshold voltage.

The second channel region C2a may be restricted to the semiconductor layer 105 under the second portion 120b of the gate electrode layer 120. The second channel region C2a may be formed in the semiconductor layer 105 between the drift region 107 and the source region 112. For example, the second channel region C2a may be formed in the semiconductor layer 105 between the protrusion 107a of the drift region 107 and the first source region 112a. Accordingly, the second channel region C2a may have a planar-type channel structure.

The second channel region C2a may have the first conductivity type such that an accumulation channel is formed. The second channel region C2a may be in contact with the source regions 112. For example, the second channel region C2a may have the same doping type as the source region 112 and the drift region 107. In this case, the source region 112, the second channel region C2a, and the drift region 107 may be normally electrically connected in structure.

However, in the structure of the semiconductor layer 105 of silicon carbide, a potential barrier is formed while a band of the second channel region C2a is upwardly bent due to the influence of negative charges generated by the formation of carbon clusters in the gate insulating layer 118. As such, there may be formed the accumulation channel that permits charges or current flow in the second channel region C2a when an operating voltage is applied to the gate electrode layer 120.

Accordingly, a threshold voltage to be applied to the gate electrode layer 120 to form the accumulation channel in the second channel region C2a may be considerably lower than a threshold voltage to be applied to the gate electrode layer 120 to form a normal inversion channel.

In some embodiments, the second channel region C2a may be a portion of the drift region 107. In more detail, the second channel region C2a may be a portion of the protrusion 107a of the drift region 107. For example, the second channel region C2a may be integrally formed with the drift region 107. As such, the source regions 112 may be in direct contact with the drift region 107, for example, the protrusion 107a, and the second channel region C2a may be restricted to a portion of the drift region 107, at which the direct contact is made.

For example, a doping concentration of the first conductivity-type impurities of the second channel region C2a may be the same as that of the remaining portion of the drift region 107 or may be different therefrom for the purpose of the adjustment of a threshold voltage.

In some embodiments, the well region 110 may be formed under the source regions 112 so as to protrude toward the protrusion 107a of the drift region 107 farther than the source regions 112. In this case, the second channel region C2a may be formed in the semiconductor layer 105 on the protruding portion of the well region 110. For example, the protrusion 107a of the drift region 107 may further extend to a groove portion between the well region 110 and the gate electrode layer 120, and the second channel region C2a may be formed at the protruding portion. The above structure may allow the second channel region C2a to be restricted between the second portion 120b of the gate electrode layer 120 and the well region 110.

In some embodiments, distances between three well regions 110 adjacent to each other from among the well regions 110 may be the same as each other. In addition, distances between three source regions 112 adjacent to each other from among the source regions 112 may be the same as each other. For example, centers of three adjacent well regions 110 may be respectively disposed at vertexes of a regular triangle, and centers of three adjacent source regions 112 on the three well regions 110 may also be respectively disposed at the vertexes of the same regular triangle. For example, the well regions 110 and the source regions 112 may be understood as indicating three triangles disposed in FIG. 15.

In some embodiments, centers of seven adjacent well regions 110 of the well regions 110 may be respectively disposed at a center and vertexes of a regular hexagon. In addition, centers of seven source regions 112 being on the seven adjacent well regions 110 from among the source regions 112 may be respectively disposed at the center and vertexes of the regular hexagon. For example, FIGS. 14 to 18 may be understood as illustrating 7 well regions 110 and 7 source regions 112 described above.

In this structure, the well regions 110 and the source regions 112 may be disposed to be similar to a planar arrangement structure in a hexagonal closed packed arrangement structure. In addition, a distance between two adjacent well regions 110 of the well regions 110 may be uniform, and a distance between two adjacent source regions 112 of the source regions 112 may be uniform.

In this structure, the trenches 116 may be disposed to form portions of lines each connecting two adjacent to each other from among the center and vertexes of the regular hexagon such that seven adjacent source regions 112 are connected. In detail, in FIG. 2, the trenches 116 may include 6 lines connecting 6 source regions 112 disposed at the vertexes with one source region 112 disposed at the center of the regular hexagon, and 6 lines each connecting two adjacent source regions from among 6 source regions 112 disposed at the vertexes.

In some embodiments, the well region 110 may be a portion of a spherical shape, and a cross section of the well region 110 may be circular. In addition, the well contact region 114 may be formed in the shape of a circle in a plan view. For example, in a plan view, the circular well contact region 114 may be formed in the circular well region 110. Lower surfaces of the well contact regions 114 may be connected with the well regions 110. In a plan view, the source region 112 may be formed in the shape of a doughnut surrounding the well contact region 114. The above shape that is viewed from above the surface of the semiconductor layer 105 may extend to a given depth from the surface of the semiconductor layer 105.

In some embodiments, in the case where a thickness of portions of the well regions 110 under the bottom surface of the trench 116, for example, a thickness of the well regions 110 around the center of the bottom surface of the trench 116 is equal to or thinner than that of the first channel region C1, the first channel region C1 may be connected with the drift region 107 under the corresponding portions.

As another example, in the case where a thickness of the well regions 110 under the bottom surface of the trench 116 is thicker than the first channel region C1 on the whole, the connection of the first channel region C1 with the drift region 107 under the trench 116 is difficult. However, in the case where the well regions 110 are in the shape of a sphere, because at least side surfaces of the trenches 116 are exposed from the well regions 110 and are surrounded by the protrusion 107a of the drift region 107, the first channel region C1 may be connected from the protrusion 107a of the drift region 107 on the side surfaces of the trenches 116 or on the side wall of the first portion 120a of the gate electrode layer 120, to the source regions 112.

In the power semiconductor device 100-2 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-2 is an N-type MOSFET, the drift region 107 and the second channel region C2a may be N− regions, the source region 112 and the drain region 102 may be N+ regions, the well region 110 and the first channel region C1 may be P− regions, and the well contact region 114 may be a P+ region.

According to the power semiconductor device 100-2, a depth of the well regions 110 may be deeper than that of the trenches 116 and the gate electrode layer 120. As such, a trench bottom corner of the first portion 120a of the gate electrode layer 120 may be surrounded by the well region 110. In addition, the whole bottom surface of the first portion 120a may be surrounded by the well regions 110; this structure may alleviate the concentration of the electric field on the trench bottom corners in the trench-type gate structure by the charge charging between the well regions 110.

In an operation of the power semiconductor device 100-2, a current may generally flow in a vertical direction from the drain region 102 along the drift region 107, and may then flow to the source region 112 through the first channel region C1 and the second channel region C2a.

The power semiconductor device 100-2 may have a hybrid structure including both the trench-type gate structure and the planar-type gate structure. In addition, the power semiconductor device 100-2 that uses both the trench-type inversion channel and the planar-type accumulation channel may increase the current density and may decrease the threshold voltage.

In addition, the power semiconductor device 100-2 may have a regular hexagon arrangement structure and may provide the high degree of integration with the high channel density by combining the trench-type gate structure and the planar-type gate structure. In addition, compared to the case where only a planar-type structure is provided, the power semiconductor device 100-2 may maintain the degree of integration through the addition of the trench-type structure and may improve the channel mobility.

Figure 20:
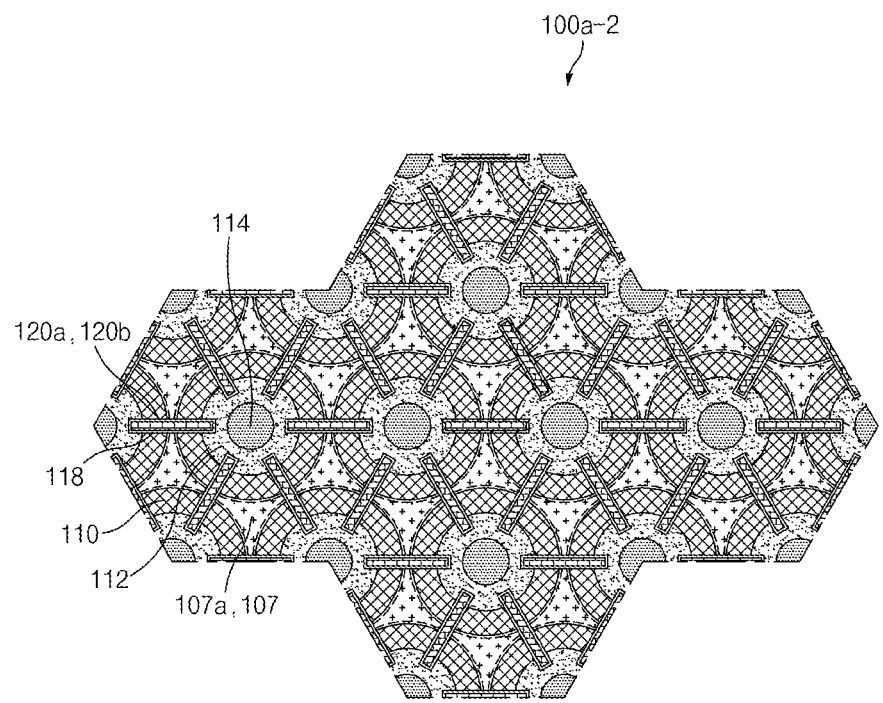
FIG. 20 is a plan view illustrating a power semiconductor device according to another embodiment of the present disclosure.

FIG. 20 is a cross-sectional view illustrating a power semiconductor device 100a-2 according to another embodiment of the present disclosure.

Referring to FIG. 20, the power semiconductor device 100a-2 shows a portion of a structure in which a plurality of power semiconductor device 100-2 (refer to FIGS. 14 to 19) are arranged.

As the hexagonal closed packed arrangement structure is repeated, the power semiconductor device 100a-2 may have the high degree of integration.

Figure 21:
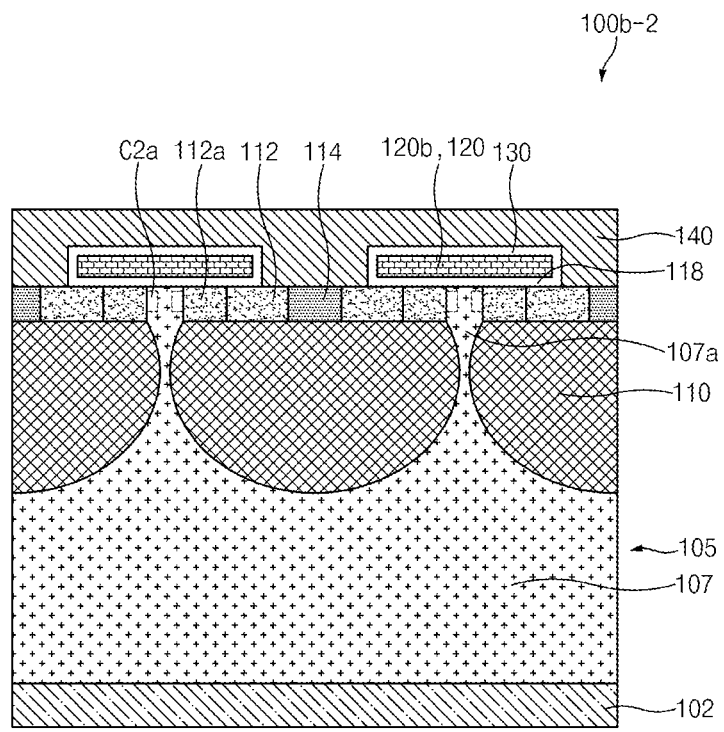
FIG. 21 is a cross-sectional view illustrating a power semiconductor device according to another embodiment of the present disclosure.

FIG. 21 is a cross-sectional view illustrating a power semiconductor device 100b-2 according to another embodiment of the present disclosure. The power semiconductor device 100b-2 may be implemented by modifying a partial configuration of the power semiconductor device 100-2 or 100a-2 of FIGS. 14 to 20, and thus, additional description will be omitted to avoid redundancy because they may be referred to each other.

Referring to FIG. 21, in the power semiconductor device 100b-2, the source regions 112 may include counter doping regions 112a, which are formed by doping first conductivity-type impurities in the well regions 110, at portions where the source regions 112 and the drift region 107 contact each other.

In this embodiment, the counter doping regions 112a may be separated and formed from the remaining portions of the source regions 112. A doping concentration of impurities of the counter doping regions 112a may be equal to or different from that of the remaining portions of the source regions 112. In some embodiments, a doping concentration of impurities of the counter doping regions 112a may be lower than that of the remaining portions of the source regions 112 or may be higher than that of the drift region 107.

Figure 22:
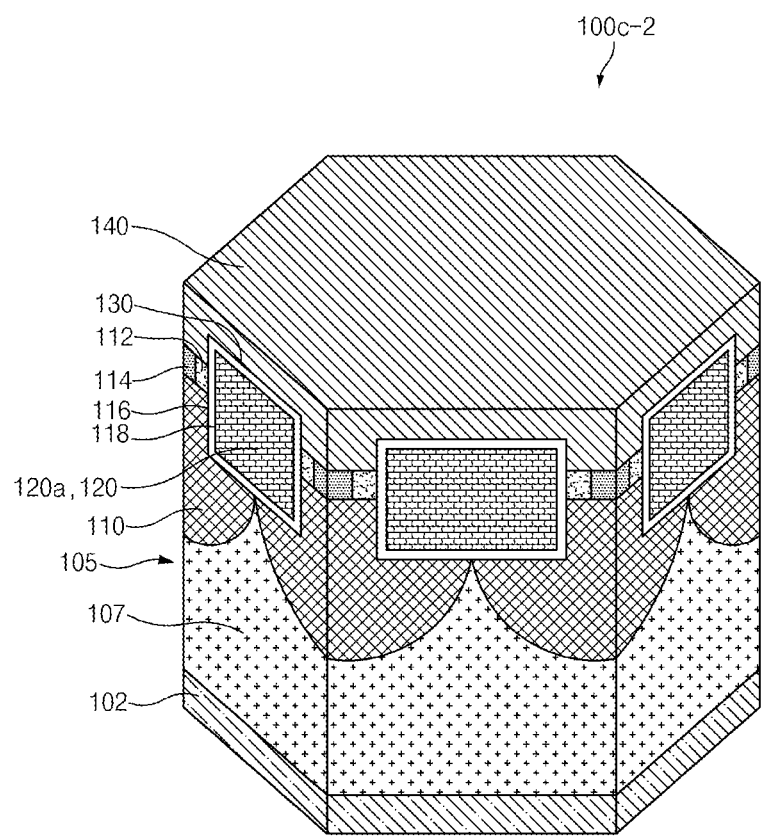
FIG. 22 is a perspective view illustrating a power semiconductor device according to another embodiment of the present disclosure.

FIG. 22 is a perspective view illustrating a power semiconductor device 100c-2 according to another embodiment of the present disclosure. The power semiconductor device 100c-2 may be implemented by modifying a partial configuration of the power semiconductor device 100-2, 100a-2, or 100b-2 of FIGS. 14 to 21, and thus, additional description will be omitted to avoid redundancy because they may be referred to each other.

Referring to FIG. 22, in the power semiconductor device 100c-2, the well regions 110 may be formed in the semiconductor layer 105 so as to be spaced from each other. In this case, a central portion of the bottom of the first portion 120a of the gate electrode layer 120 may be exposed to the well regions 110, but at least opposite bottom corners thereof may be surrounded by the well regions 110.

In this embodiment, unlike FIG. 3, because the well regions 110 are spaced from each other, a central portion of the bottom of the trench 116 may be in contact with the drift region 107.

Figure 23:
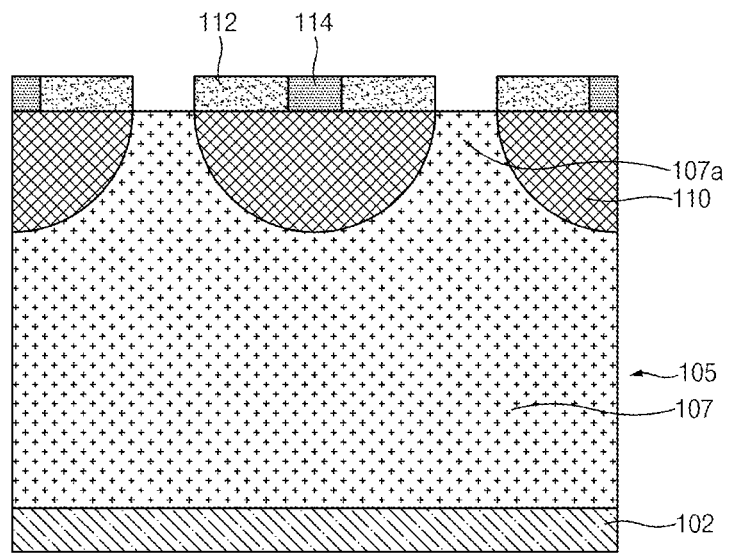
FIGS. 23, 24, 25 and 27 are cross-sectional views illustrating a method of fabricating a power semiconductor device according to an embodiment of the present disclosure.
Figure 24:
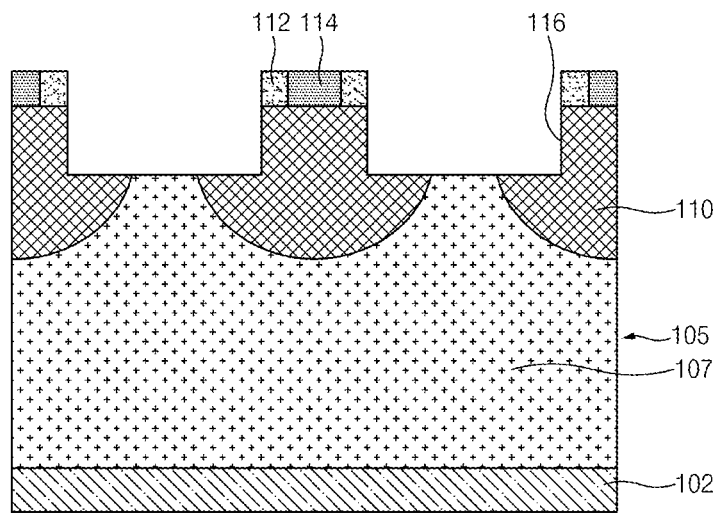
Figure 25:
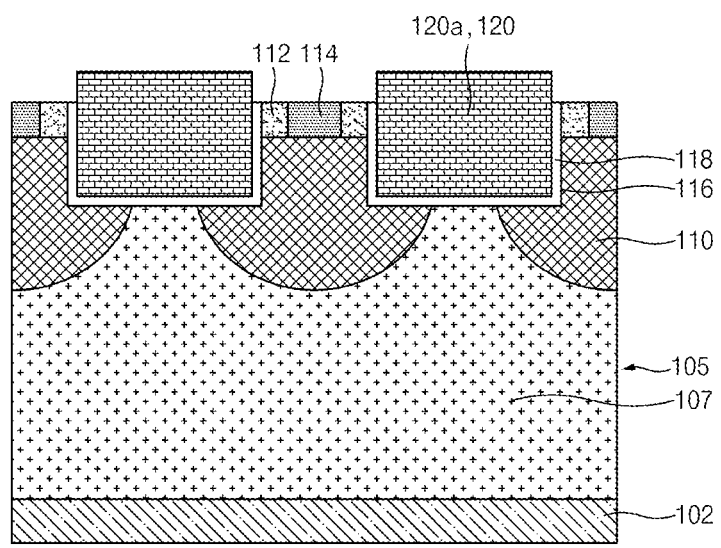
Figure 26:
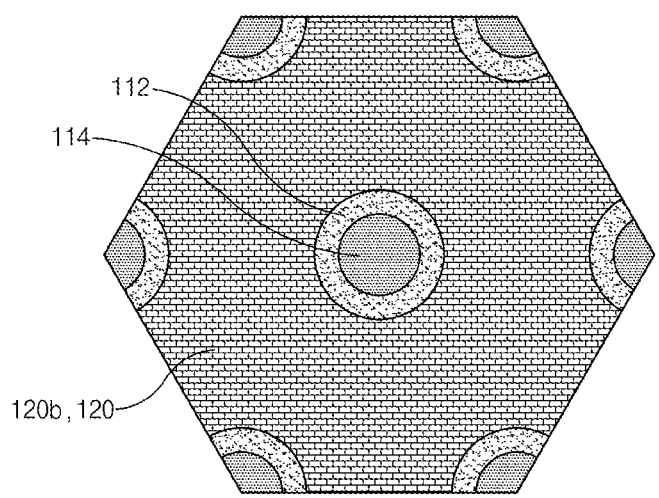
FIG. 26 is a plan view illustrating a method of fabricating a power semiconductor device of FIG. 25.

FIGS. 23 to 25 and 27 are cross-sectional views illustrating a method of fabricating the power semiconductor device 100-2 according to an embodiment of the present disclosure, and FIG. 26 is a plan view of FIG. 25.

Referring to FIG. 23, the drift region 107 having the first conductivity type may be formed in the semiconductor layer 105 of silicon carbide (SiC) such that a vertical transport path of charges is provided. For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well regions 110 having the second conductivity type may be formed in the semiconductor layer 105 so as to be in contact with the drift region 107. For example, the well regions 110 may be formed such that two adjacent well regions at least partially contact each other. In addition, the forming of the well regions 110 may include implanting impurities of the second conductivity type into the semiconductor layer 105. The well regions 110 may be formed with a given depth substantially from the surface of the semiconductor layer 105.

For example, the well regions 110 may be formed in the semiconductor layer 105 such that the drift region 107 includes the protrusions 107a, at least portions of which are surrounded by the well regions 110. In more detail, the well regions 110 may be formed by doping impurities of a conductivity type opposite to that of the drift region 107 in the drift region 107.

The source regions 112 having the first conductivity type may be formed in the well regions 110 or on in the semiconductor layer 105 on the well regions 110. For example, the source regions 112 may be formed by implanting impurities of the first conductivity type into the well regions 110 and the drift region 107. The source regions 112 may be formed in the well region 110 with a given depth substantially from the surface of the semiconductor layer 105.

In addition, the well contact regions 114 having the second conductivity type may be formed in the source regions 112 or on the well regions 110. For example, the well contact regions 114 may be formed by implanting second conductivity-type impurities into the well regions 110 or into the source regions 112 at a high concentration. For example, the well contact regions 114 may be formed to have a circular shape in a plan view.

In some embodiments, the well regions 110 may be formed to be in contact with the drift region 107 such that the drift region 107 is connected with the surface of the semiconductor layer 105 through between the well regions 110 from the lower side of the well regions 110.

In a modified example of this embodiment, an order in which the well regions 110, the well contact regions 114, and the source regions 112 are doped with impurities may be changed arbitrarily.

In the above fabricating method, the impurity implantation or the impurity doping may be performed such that the impurities are mixed when the impurities are implanted into the semiconductor layer 105 or an epitaxial layer is formed. However, the ion implantation method using a mask pattern may be used to implant impurities into a selective region.

Optionally, a heat treatment process for activating or diffusing the impurities may be performed after the ion implantation.

Referring to FIG. 24, the plurality of trenches 116 may be formed to be recessed into the semiconductor layer 105 from the surface of the semiconductor layer 105 as much as a given depth.

For example, the trenches 116 may be formed to penetrate portions of the source regions 112 and to be recessed to a given depth of the well regions 110 and the protrusions 107a of the drift region 107. In more detail, the trenches 116 may be formed to be recessed into the semiconductor layer 105 from the surface of the semiconductor layer 105 so as to connect two source regions adjacent to each other from the source regions 112 across a place where the two adjacent well regions contact each other.

For example, the trenches 116 may be formed by forming a photo mask by using photo lithography and then etching the semiconductor layer 105 by using the photo mask as an etching protection layer.

Referring to FIGS. 25 and 26, the gate insulating layer 118 may be formed on the inner walls of the trenches 116 and the surface of the semiconductor layer 105. For example, the gate insulating layer 118 may be formed by oxidizing the semiconductor layer 105 to form an oxide or by depositing an insulating material such as oxide or nitride on the semiconductor layer 105.

Afterwards, the gate electrode layer 120 that includes the first portion 120a burying the trenches 116 and the second portion 120b on the surface of the semiconductor layer 105 may be formed on the gate insulating layer 118. For example, the gate electrode layer 120 may be formed by forming a conductive layer on the gate insulating layer 118 and then patterning the conductive layer. The gate electrode layer 120 may be formed by doping impurities in polysilicon or may be formed to include a conductive metal or metal silicide.

A patterning process may be performed by using the photo lithography and etching processes. The photo lithography process may include a process of forming a photoresist pattern as a mask layer by using a photo process and a development process, and the etching process may include a process of selectively etching an underlying structure by using the photoresist pattern.

Figure 27:
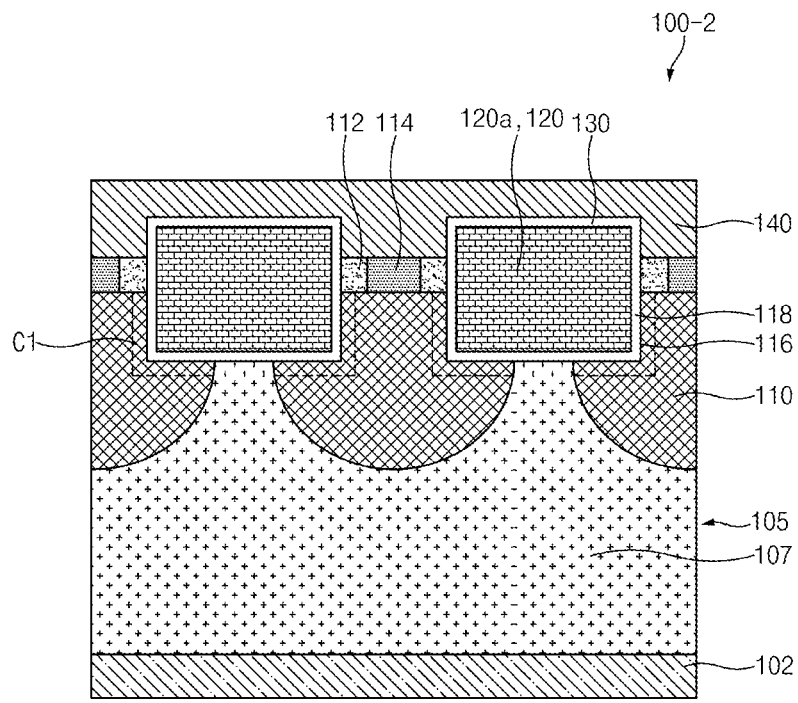

Referring to FIG. 27, the interlayer insulating layer 130 may be formed on the gate electrode layer 120.

Afterwards, the source electrode layer 140 may be formed on the interlayer insulating layer 130. In addition, the source electrode layer 140 may be formed to be connected with the source regions 112 and the well contact regions 114. For example, the source electrode layer 140 may be formed by forming a conductive layer, for example, a metal layer on the interlayer insulating layer 130 and patterning the conductive layer.

According the fabricating method described above, the MOSFET structure having the hexagonal closed packed arrangement in the semiconductor layer 105 may be economically formed.

The fabricating method described above may be applied to the power semiconductor devices 100a-2, 100b-2, and 100c-2 of FIGS. 20 to 22 without modification.

Figure 28:
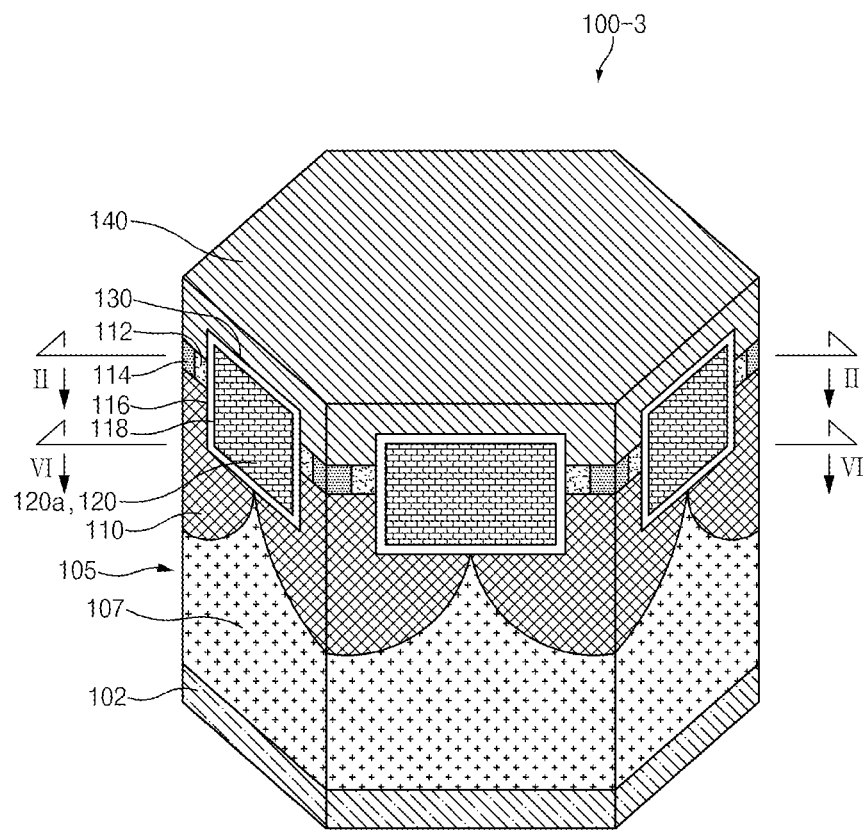
FIG. 28 is a schematic perspective view illustrating a power semiconductor device according to an embodiment of the present disclosure.
Figure 29:
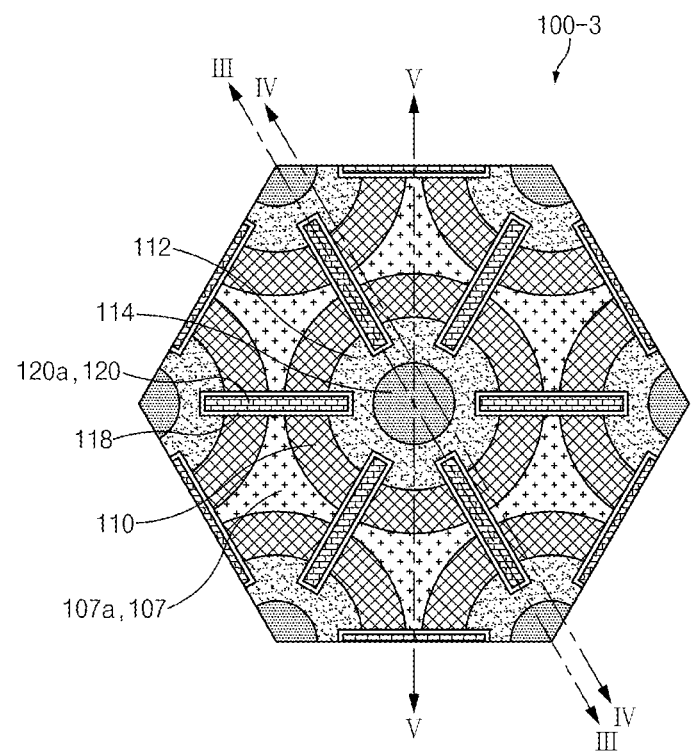
FIG. 29 is a plan view illustrating a power semiconductor device taken along line II-II of FIG. 28.
Figure 30:
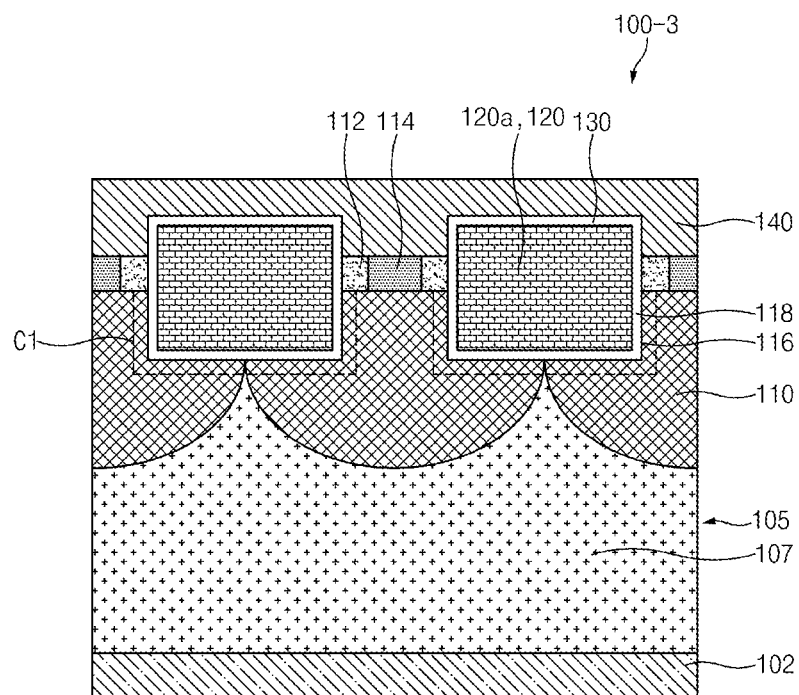
FIG. 30 is a cross-sectional view illustrating a power semiconductor device taken along line of FIG. 29.
Figure 31:
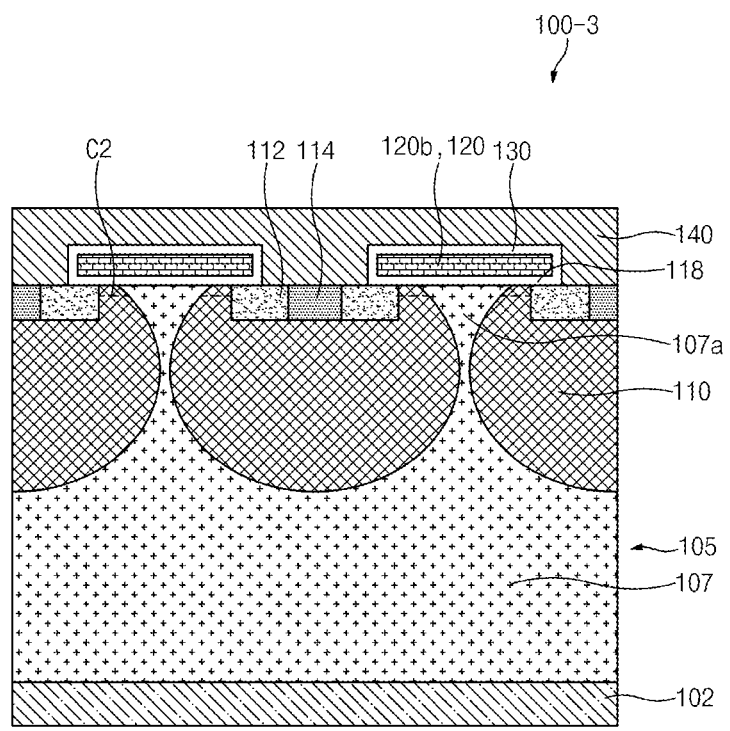
FIG. 31 is a cross-sectional view illustrating a power semiconductor device taken along line IV-IV of FIG. 29.
Figure 32:
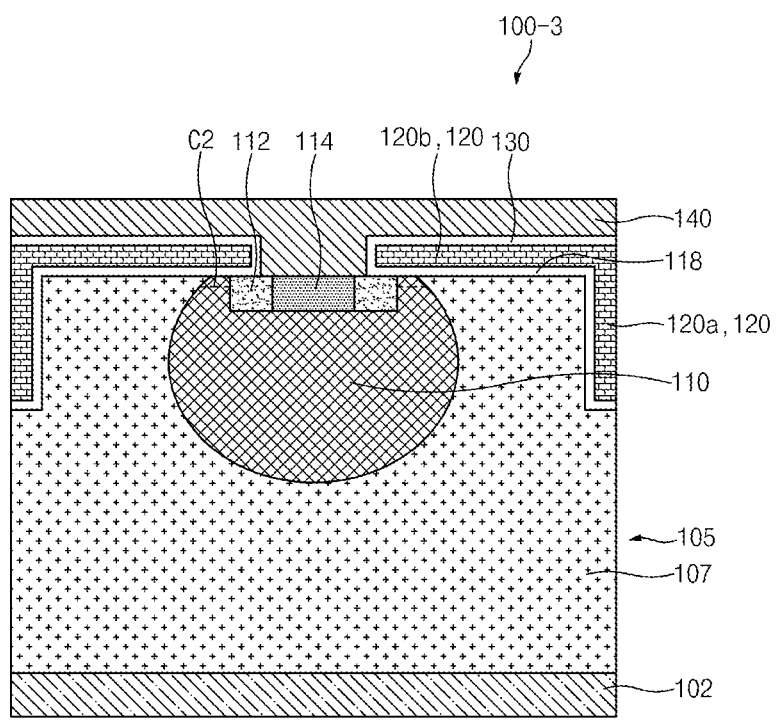
FIG. 32 is a cross-sectional view illustrating a power semiconductor device taken along line V-V of FIG. 29.
Figure 33:
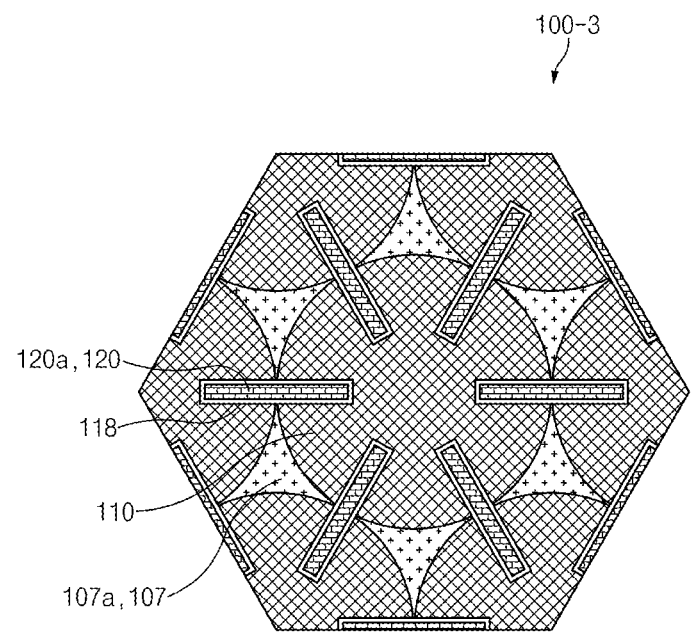
FIG. 33 is a plan view illustrating a power semiconductor device taken along line VI-VI of FIG. 28.

FIG. 28 is a schematic perspective view illustrating a power semiconductor device 100-3 according to an embodiment of the present disclosure, FIG. 29 is a plan view illustrating the power semiconductor device 100-3 taken along line II-II of FIG. 28, FIG. 30 is a cross-sectional view illustrating the power semiconductor device 100-3 taken along line of FIG. 29, FIG. 31 is a cross-sectional view illustrating the power semiconductor device 100-3 taken along line IV-IV of FIG. 29, and FIG. 32 is a cross-sectional view illustrating the power semiconductor device 100-3 taken along line V-V of FIG. 29, and FIG. 33 is a plan view illustrating the power semiconductor device 100-3 taken along line VI-VI of FIG. 28.

Referring to FIGS. 28 to 33, the power semiconductor device 100-3 may at least include the semiconductor layer 105, the gate insulating layer 118, and the gate electrode layer 120. For example, the power semiconductor device 100-3 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be foiled of silicon carbide (SiC). In more detail, the semiconductor layer 105 may include at least one epitaxial layer of silicon carbide.

Silicon carbide (SiC) may have a wider bandgap than silicon, thus maintaining stability even at a high temperature compared to silicon. In addition, because a breakdown electric field of the silicon carbide is much higher than that of the silicon, the silicon carbide may stably operate even at a high temperature. Accordingly, the power semiconductor device 100-3 using silicon carbide as the semiconductor layer 105 may have a high breakdown voltage compared to the case of using silicon and may provide an excellent heat emission (or release) characteristic and a stable operating characteristic at a high temperature.

In detail, the semiconductor layer 105 may include the plurality of well regions 110, the plurality of source regions 112, and the drift region 107.

The drift region 107 may have the first conductivity type and may be formed by implanting impurities of the first conductivity type into a portion of the semiconductor layer 105. For example, the drift region 107 may be formed by doping impurities of the first conductivity type in an epitaxial layer of silicon carbide. The drift region 107 may provide a vertical transport path of charges.

The well regions 110 may be formed in the semiconductor layer 105 and may have the second conductivity type. For example, the well regions 110 may be formed in the semiconductor layer 105 so as to be in contact with at least a portion of the drift region 107. In some embodiments, the well regions 110 may be formed by doping impurities of the second conductivity type opposite to the first conductivity type in the semiconductor layer 105 or the drift region 107.

The source regions 112 may be formed in the semiconductor layer 105 on the well regions 110 and may have the first conductivity type. For example, the source region 112 may be formed by doping impurities of the first conductivity type in the semiconductor layer 105 or the well region 110. The concentration of the first conductivity-type impurities doped in the source region 112 may be higher than that doped in the drift region 107.

A plurality of well contact regions 114 may be formed in the source regions 112 and on the well regions 110. For example, the plurality of well contact regions 114 may be formed on the well regions 110 so as to be connected with the well regions 110 through the source regions 112. The well contact regions 114 may be formed to have the second conductivity type.

The well contact regions 114 may be connected with a source electrode layer 140, and may be doped with second conductivity-type impurities of a higher concentration than the well regions 110 for the purpose of reducing a contact resistance when connected with the source electrode layer 140.

In some embodiments, the well contact regions 114 may be formed in a recess groove being in contact with the well regions 110. In this case, the source electrode layer 140 may be formed to fill the recess groove and may be connected with the well contact region 114.

In addition, the drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a portion of the semiconductor layer 105 or may be understood as a substrate independent of the semiconductor layer 105. In addition, in some embodiments, the drain region 102 may be implemented with a substrate of silicon carbide having the first conductivity type, and the drift region 107 may be formed on the drain region 102 by using one or more epitaxial layers.

In some embodiments, the well regions 110 may be formed in the semiconductor layer 105 such that two adjacent well regions at least partially contact each other. In addition, the well regions 110 may have a shape in which a width thereof increases as it goes to the inside of the semiconductor layer 105 from the surface of the semiconductor layer 105 and then decreases. In detail, two well regions adjacent to each other of the well regions 110 may contact each other, as illustrated in FIG. 33, at a place where at least a width thereof is the largest and may be spaced from each other on the surface of the semiconductor layer 105 as illustrated in FIG. 29.

In some embodiments, the drift region 107 may be formed in the semiconductor layer 105 so as to be connected from the lower side of the well regions 110 to the surface of the semiconductor layer 105 through between the well regions 110. For example, the drift region 107 may include protrusions 107a extended to the surface of the semiconductor layer 105 between the well regions 110.

The plurality of trenches 116 may be formed to be recessed into the semiconductor layer 105 from the surface of the semiconductor layer 105 as much as a given depth. For example, the trenches 116 may be formed to connect two source regions adjacent to each other from the source regions 112 across a place where two well regions adjacent to each other from among the well regions 110 contact each other. In detail, each trench 116 may be formed in a line type in which one source region 112 is connected with an adjacent source region 112 across one well regions 110 surrounding the one source region 112, the protrusion 107a of the drift region 107, and an adjacent well region 110.

For example, the trenches 116 may be formed to penetrate portions of the source regions 112 and to be recessed to a given depth of the well regions 110 and the protrusions 107a of the drift region 107. Accordingly, opposite corners (or edges) of the trenches 116 may be surrounded by the well regions 110. In addition, when viewed from the cross section of the trenches 116 taken along an extending direction thereof, bottom surfaces of the trenches 116 may be surrounded by the well regions 110 on the whole. For example, two well regions adjacent to each other from among the well regions 110 may be formed to contact each other on the bottom surfaces of the trenches 116 or around the bottom surfaces thereof, and thus, the bottom surfaces of the trenches 116 may be surrounded by the well regions 110 at least on a line according to the extending direction.

The gate insulating layer 118 may be formed on inner walls of the trenches 116 and at least a portion of the semiconductor layer 105. For example, the gate insulating layer 118 may be formed on the inner walls of the trenches 116 and the surface of the semiconductor layer 105.

For example, the gate insulating layer 118 may include an insulating material such as silicon oxide, silicon carbide oxide, silicon nitride, hafnium oxide, zirconium oxide, or aluminum oxide, or may include a stacked structure thereof.

The gate electrode layer 120 may be formed on the gate insulating layer 118. For example, the gate electrode layer 120 may include the first portion 120a burying the trenches 116 and the second portion 120b on the surface of the semiconductor layer 105. For example, the first portion 120a of the gate electrode layer 120 may have a trench-type gate structure, and the second portion 120b may have a planar-type gate structure. Accordingly, the gate electrode layer 120 may have a hybrid-type structure including both the trench-type gate structure and the planar-type gate structure.

For example, the second portion 120b of the gate electrode layer 120 may be formed on the protrusions 107a of the drift region 107 and the well regions 110. In detail, the second portion 120b of the gate electrode layer 120 may be formed on 1) the protrusions 107a of the drift region 107, which are exposed on the surface of the semiconductor layer 105, 2) surfaces of the well regions 112, and 3) surfaces of portions of peripheries of the source regions 112. The well contact regions 114 and the remaining portions of the source regions 112 may be disposed on the outside of the gate electrode layer 120 and may be exposed from the gate electrode layer 120.

Trench bottom corner portions of the first portion 120a of the gate electrode layer 120 may be surrounded by the well regions 110. In addition, when viewed from the cross section of the first portion 120a taken along an extending direction thereof, a bottom surface of the first portion 120a may be surrounded by the well regions 110 on the whole. For example, portions of the well regions 110, which surround the bottom surface of the first portion 120*a*, may be the thinnest at a central portion of the bottom surface of the first portion 120*a* and may be gradually become thicker as it goes toward a corner portion thereof.

An example in which two adjacent well regions 110 contact each other at the center of the bottom surface of the trench 116 is illustrated in FIG. 30, but the two adjacent well regions 110 may further overlap each other around the center of the bottom surface of the trench 116. In this case, in FIG. 32, the well regions 110 may be further disposed under the bottom surface of the trench 116.

For example, the gate electrode layer 120 may include an appropriate conductive material such as polysilicon, metal, metal nitride, or metal silicide, or may include a stacked structure thereof.

An interlayer insulating layer 130 may be formed on the gate electrode layer 120. For example, the interlayer insulating layer 130 may include an appropriate insulating material such as an oxide layer or a nitride layer, or may include a stacked structure thereof.

The source electrode layer 140 may be formed on the interlayer insulating layer 130. In addition, the source electrode layer 140 may be connected in common with the source regions 112 and the well contact regions 114. For example, the source electrode layer 140 may be connected with the source region 112 and the well contact region 114 through a portion exposed by the gate electrode layer 120 and may be disposed to further extend onto the gate electrode layer 120. For example, the source electrode layer 140 may be formed of an appropriate conductive material, metal, or the like.

A first channel region C1 may be formed in the semiconductor layer 105 along the trench 116 corresponding to the first portion 120*a* of the gate electrode layer 120 so as to be connected with the source regions 112 and the drift region 107. For example, the first channel region C1 may be formed in the semiconductor layer 105 along side walls of the trench 116 so as to be connected between the drift region 107 under the trench 116 or on a side surface of the trench 116, for example, the protrusion 107*a* of the drift region 107 and the source regions 112 contacting the trench 116. Accordingly, the first channel region C1 may have a trench-type channel structure.

A second channel region C2 may be formed in the semiconductor layer 105 under the second portion 120*b* of the gate electrode layer 120 so as to be in contact with the source regions 112. For example, the second channel region C2 may be formed on the semiconductor layer 105 between the protrusion 107*a* of the drift region 107 and the source regions 112. The second channel region C2 may be formed to cover surfaces of the well regions 110. Accordingly, the second channel region C2 may have a planar-type channel structure.

For example, the first channel region C1 and the second channel region C2 may have the second conductivity type such that an inversion channel is formed. Because the first channel region C1 and the second channel region C2 have a doping type opposite to that of the source region 112 and the drift region 107, the first channel region C1 and the second channel region C2 may form a diode junction with the source region 112 and the drift region 107.

Accordingly, the first channel region C1 and the second channel region C2 may not permit charges to move in a normal situation; however, when an operating voltage is applied to the gate electrode layer 120, the inversion channel may be formed therein such that the movement of charges is permitted.

For example, the first channel region C1 and the second channel region C2 may be portions of the well regions 110. In detail, the first channel region C1 may be portions of the well regions 110 adjacent to a lower surface of the first portion 120*a* of the gate electrode layer 120, and the second channel region C2 may be portions of the well regions 110 adjacent to a lower surface of the second portion 120*b* of the gate electrode layer 120.

In this case, the first channel region C1 and the second channel region C2 may be integrally formed with the well regions 110 or may be formed to be continuously connected with the well regions 110. A doping concentration of the second conductivity-type impurities of the first channel region C1 and the second channel region C2 may be the same as that of the remaining portion of the well region 110 or may be different therefrom for the purpose of the adjustment of a threshold voltage.

In some embodiments, distances between three well regions 110 adjacent to each other from among the well regions 110 may be the same as each other. In addition, distances between three source regions 112 adjacent to each other from among the source regions 112 may be the same as each other. For example, centers of three adjacent well regions 110 may be respectively disposed at vertexes of a regular triangle, and centers of three adjacent source regions 112 on the three well regions 110 may also be respectively disposed at the vertexes of the same regular triangle. For example, the well regions 110 and the source regions 112 may be understood as indicating three triangles disposed in FIG. 29.

In some embodiments, centers of seven adjacent well regions 110 of the well regions 110 may be respectively disposed at a center and vertexes of a regular hexagon. In addition, centers of seven source regions 112 being on the seven adjacent well regions 110 from among the source regions 112 may be respectively disposed at the center and vertexes of the regular hexagon. For example, FIGS. 28 to 32 may be understood as illustrating 7 well regions 110 and 7 source regions 112 described above.

In this structure, the well regions 110 and the source regions 112 may be disposed to be similar to a planar arrangement structure in a hexagonal closed packed arrangement structure. In addition, a distance between two adjacent well regions 110 of the well regions 110 may be uniform, and a distance between two adjacent source regions 112 of the source regions 112 may be uniform.

In this structure, the trenches 116 may be disposed to form portions of lines each connecting two adjacent to each other from among the center and vertexes of the regular hexagon such that seven adjacent source regions 112 are connected. In detail, in FIG. 29, the trenches 116 may include 6 lines connecting 6 source regions 112 disposed at the vertexes with one source region 112 disposed at the center of the regular hexagon, and 6 lines each connecting two adjacent source regions from among 6 source regions 112 disposed at the vertexes.

In some embodiments, the well region 110 may be a portion of a spherical shape, and a cross section of the well region 110 may be circular. In addition, the well contact region 114 may be formed in the shape of a circle in a plan view. For example, in a plan view, the circular well contact region 114 may be formed in the circular well region 110. Lower surfaces of the well contact regions 114 may be connected with the well regions 110. In a plan view, the source region 112 may be formed in the shape of a doughnut surrounding the well contact region 114. The above shape that is viewed from above the surface of the semiconductor layer 105 may extend to a given depth from the surface of the semiconductor layer 105.

In some embodiments, in the case where a thickness of portions of the well regions 110 under the bottom surface of the trench 116, for example, a thickness of the well regions 110 around the center of the bottom surface of the trench 116 is equal to or thinner than that of the first channel region C1, the first channel region C1 may be connected with the drift region 107 under the corresponding portions.

As another example, in the case where a thickness of the well regions 110 under the bottom surface of the trench 116 is thicker than the first channel region C1 on the whole, the connection of the first channel region C1 with the drift region 107 under the trench 116 is difficult. However, in the case where the well regions 110 are in the shape of a sphere, because at least side surfaces of the trenches 116 are exposed from the well regions 110 and are surrounded by the protrusion 107a of the drift region 107, the first channel region C1 may be connected from the protrusion 107a of the drift region 107 on the side surfaces of the trenches 116 or on the side wall of the first portion 120a of the gate electrode layer 120, to the source regions 112.

In the power semiconductor device 100-3 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-3 is an N-type MOSFET, the drift region 107 may be an N− region, the source region 112 and the drain region 102 may be N+ regions, the well region 110, the first channel region C1, and the second channel region C2 may be P− regions, and the well contact region 114 may be a P+ region.

According to the power semiconductor device 100-3, a depth of the well regions 110 may be deeper than that of the trenches 116 and the gate electrode layer 120. As such, a trench bottom corner of the first portion 120a of the gate electrode layer 120 may be surrounded by the well region 110. In addition, the whole bottom surface of the first portion 120a may be surrounded by the well regions 110; this structure may alleviate the concentration of the electric field on the trench bottom corners in the trench-type gate structure.

In an operation of the power semiconductor device 100-3, a current may generally flow in a vertical direction from the drain region 102 along the drift region 107, and may then flow to the source region 112 through the first channel region C1 and the second channel region C2.

The power semiconductor device 100-3 may have a hybrid structure including both the trench-type gate structure and the planar-type gate structure. In addition, the power semiconductor device 100-3 may have a regular hexagon arrangement structure and may provide the high degree of integration with the high channel density by combining the trench-type gate structure and the planar-type gate structure. In addition, compared to the case where only a planar-type structure is provided, the power semiconductor device 100-3 may maintain the degree of integration through the addition of the trench-type structure and may improve the channel mobility.

Figure 34:
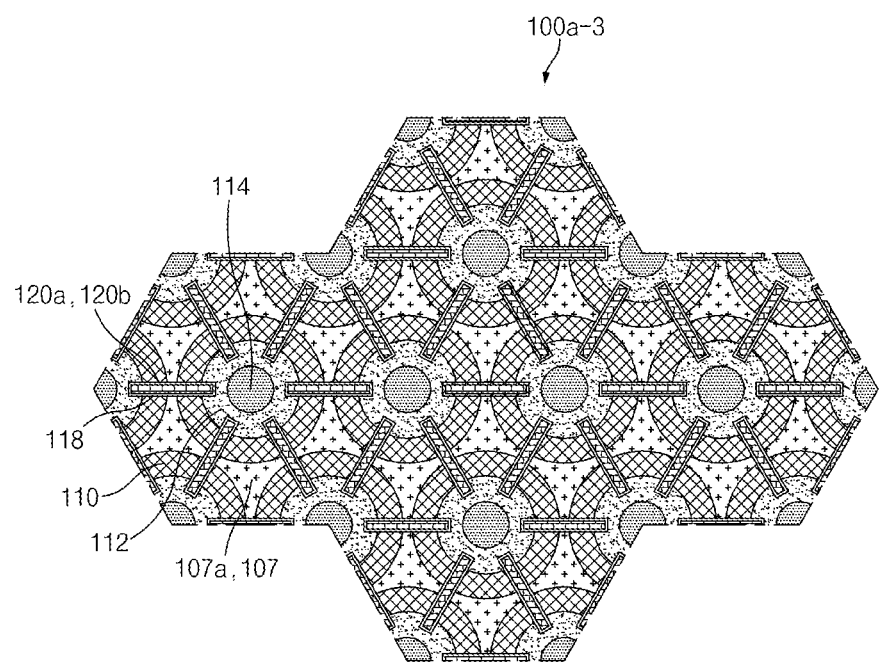
FIG. 34 is a plan view illustrating a power semiconductor device according to another embodiment of the present disclosure.

FIG. 34 is a perspective view illustrating a power semiconductor device 100a-3 according to another embodiment of the present disclosure.

Referring to FIG. 34, the power semiconductor device 100a-3 shows a portion of a structure in which a plurality of power semiconductor device 100-3 (refer to FIGS. 28 to 33) are arranged.

As the hexagonal closed packed arrangement structure is repeated, the power semiconductor device 100a-3 may have the high degree of integration.

Figure 35:
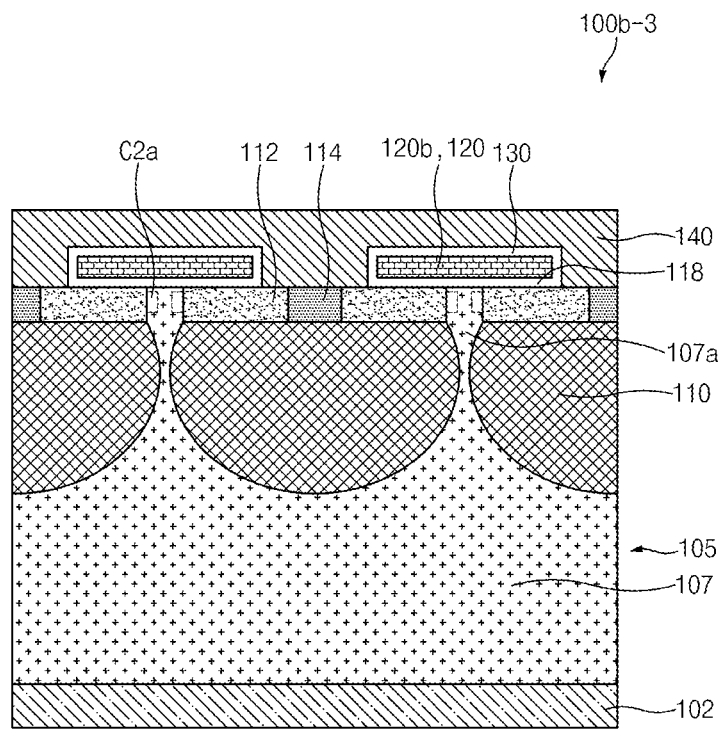
FIGS. 35 and 36 are cross-sectional views illustrating a power semiconductor device according to another embodiment of the present disclosure.
Figure 36:
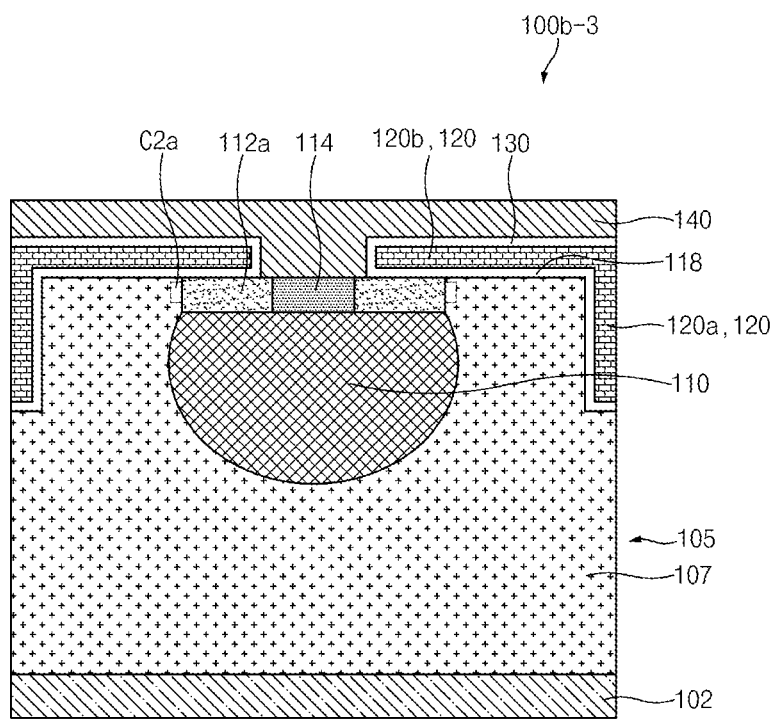

FIGS. 35 and 36 are cross-sectional views illustrating a power semiconductor device 100b-3 according to another embodiment of the present disclosure. The power semiconductor device 100b-3 may be implemented by modifying a partial configuration of the power semiconductor device 100-3 of FIGS. 28 to 33, and thus, additional description will be omitted to avoid redundancy because they may be referred to each other.

Referring to FIGS. 35 and 36, in the power semiconductor device 100b-3, a second channel region C2a may be formed in the semiconductor layer 105 between the drift region 107 and the source region 112. For example, the second channel region C2a may be formed in the semiconductor layer 105 between the protrusion 107a of the drift region 107 and the first source region 112a. The second channel region C2a may have the first conductivity type such that an accumulation channel is formed.

For example, the second channel region C2a may have the same doping type as the source region 112 and the drift region 107. In this case, the source region 112, the second channel region C2a, and the drift region 107 may be normally electrically connected in structure. However, in the structure of the semiconductor layer 105 of silicon carbide, a potential barrier is formed while a band of the second channel region C2a is upwardly bent due to the influence of negative charges generated by the formation of carbon clusters in the gate insulating layer 118. As such, there may be formed the accumulation channel that permits charges or current flow in the second channel region C2a when an operating voltage is applied to the gate electrode layer 120.

Accordingly, a threshold voltage to be applied to the gate electrode layer 120 to form the accumulation channel in the second channel region C2a may be considerably lower than a threshold voltage to be applied to the gate electrode layer 120 to form a normal inversion channel.

In some embodiments, the second channel region C2a may be a portion of the drift region 107. In more detail, the second channel region C2a may be a portion of the protrusion 107a of the drift region 107. For example, the second channel region C2a may be integrally formed with the drift region 107. As such, in the power semiconductor device 100b-3, the source regions 112 may be in direct contact with the drift region 107, for example, the protrusion 107a, and the second channel region C2a may be restricted to a portion of the drift region 107, at which the direct contact is made.

For example, a doping concentration of the first conductivity-type impurities of the second channel region C2a may be the same as that of the remaining portion of the drift region 107 or may be different therefrom for the purpose of the adjustment of a threshold voltage.

In some embodiments, the well region 110 may be formed under the source regions 112 so as to protrude toward the protrusion 107a of the drift region 107 farther than the source regions 112. In this case, the second channel region C2a may be formed in the semiconductor layer 105 on the protruding portion of the well region 110. For example, the protrusion 107a of the drift region 107 may further extend to a groove portion between the well region 110 and the gate electrode layer 120, and the second channel region C2a may be formed at the protruding portion. The above structure may allow the second channel region C2a to be restricted between the second portion 120b of the gate electrode layer 120 and the well region 110.

In the power semiconductor device 100b-3, the first channel region C1 may be provided as an inversion channel like the power semiconductor device 100-3 of FIGS. 28 to 33.

Figure 37:
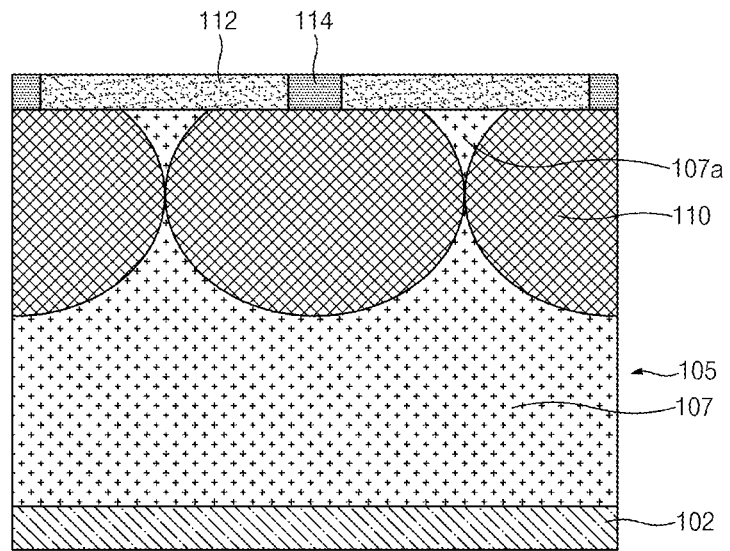
FIGS. 37, 38, 39 and 41 are cross-sectional views illustrating a method of fabricating a power semiconductor device according to an embodiment of the present disclosure.
Figure 38:
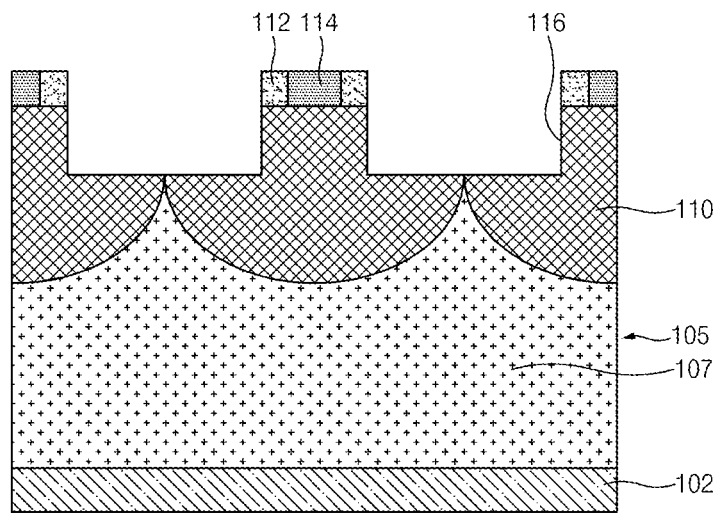
Figure 39:
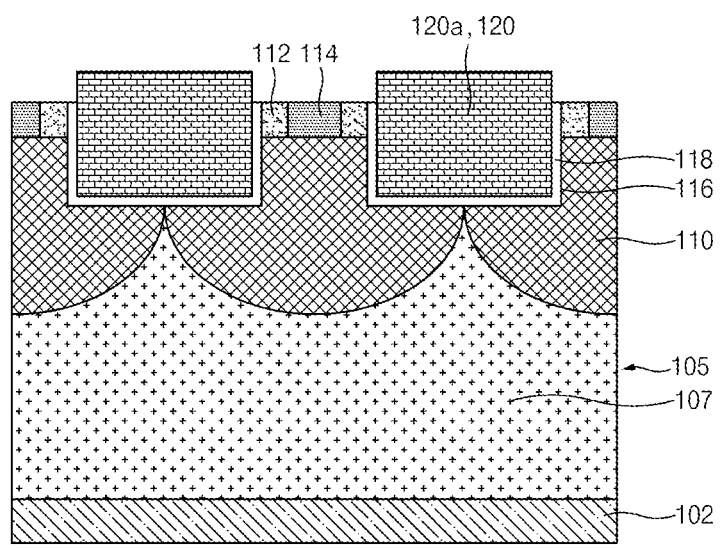
Figure 40:
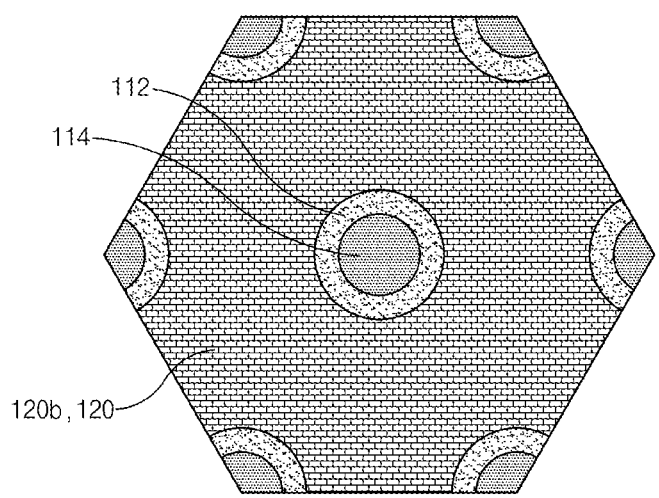
FIG. 40 is a plan view illustrating a power semiconductor device of FIG. 39.

FIGS. 37 to 39 and 41 are cross-sectional views illustrating a method of fabricating the power semiconductor device 100-3 according to an embodiment of the present disclosure, and FIG. 40 is a plan view of FIG. 39.

Referring to FIG. 37, the drift region 107 having the first conductivity type may be formed in the semiconductor layer 105 of silicon carbide (SiC) such that a vertical transport path of charges is provided. For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well regions 110 having the second conductivity type may be formed in the semiconductor layer 105 so as to be in contact with the drift region 107. For example, the well regions 110 may be formed such that two adjacent well regions at least partially contact each other. In addition, the forming of the well regions 110 may include implanting impurities of the second conductivity type into the semiconductor layer 105. The well regions 110 may be formed with a given depth substantially from the surface of the semiconductor layer 105.

For example, the well regions 110 may be formed in the semiconductor layer 105 such that the drift region 107 includes the protrusions 107a, at least portions of which are surrounded by the well regions 110. In more detail, the well regions 110 may be formed by doping impurities of a conductivity type opposite to that of the drift region 107 in the drift region 107.

The source regions 112 having the first conductivity type may be formed in the well regions 110 or on in the semiconductor layer 105 on the well regions 110. For example, the source regions 112 may be formed by implanting impurities of the first conductivity type into the well regions 110 and the drift region 107. The source regions 112 may be formed in the well region 110 with a given depth substantially from the surface of the semiconductor layer 105.

In addition, the well contact regions 114 having the second conductivity type may be formed in the source regions 112 or on the well regions 110. For example, the well contact regions 114 may be formed by implanting second conductivity-type impurities into the well regions 110 or into the source regions 112 at a high concentration. For example, the well contact regions 114 may be formed to have a circular shape in a plan view.

In some embodiments, the well regions 110 may be formed to be in contact with the drift region 107 such that the drift region 107 is connected with the surface of the semiconductor layer 105 through between the well regions 110 from the lower side of the well regions 110.

In a modified example of this embodiment, an order in which the well regions 110, the well contact regions 114, and the source regions 112 are doped with impurities may be changed arbitrarily.

In the above fabricating method, the impurity implantation or the impurity doping may be performed such that the impurities are mixed when the impurities are implanted into the semiconductor layer 105 or an epitaxial layer is formed. However, the ion implantation method using a mask pattern may be used to implant impurities into a selective region.

Optionally, a heat treatment process for activating or diffusing the impurities may be performed after the ion implantation.

Referring to FIG. 38, a plurality of trenches 116 may be formed to be recessed into the semiconductor layer 105 from the surface of the semiconductor layer 105 as much as a given depth.

For example, the trenches 116 may be formed to penetrate portions of the source regions 112 and to be recessed to a given depth of the well regions 110 and the protrusions 107a of the drift region 107. In more detail, the trenches 116 may be formed to be recessed into the semiconductor layer 105 from the surface of the semiconductor layer 105 so as to connect two source regions adjacent to each other from the source regions 112 across a place where the two adjacent well regions contact each other.

For example, the trenches 116 may be formed by forming a photo mask by using photo lithography and then etching the semiconductor layer 105 by using the photo mask as an etching protection layer.

Referring to FIGS. 39 and 40, the gate insulating layer 118 may be formed on the inner walls of the trenches 116 and the surface of the semiconductor layer 105. For example, the gate insulating layer 118 may be formed by oxidizing the semiconductor layer 105 to form an oxide or by depositing an insulating material such as oxide or nitride on the semiconductor layer 105.

Afterwards, the gate electrode layer 120 that includes the first portion 120a burying the trenches 116 and the second portion 120b on the surface of the semiconductor layer 105 may be formed on the gate insulating layer 118. For example, the gate electrode layer 120 may be formed by forming a conductive layer on the gate insulating layer 118 and then patterning the conductive layer. The gate electrode layer 120 may be formed by doping impurities in polysilicon or may be formed to include a conductive metal or metal silicide.

A patterning process may be performed by using the photo lithography and etching processes. The photo lithography process may include a process of forming a photoresist pattern as a mask layer by using a photo process and a development process, and the etching process may include a process of selectively etching an underlying structure by using the photoresist pattern.

Figure 41:
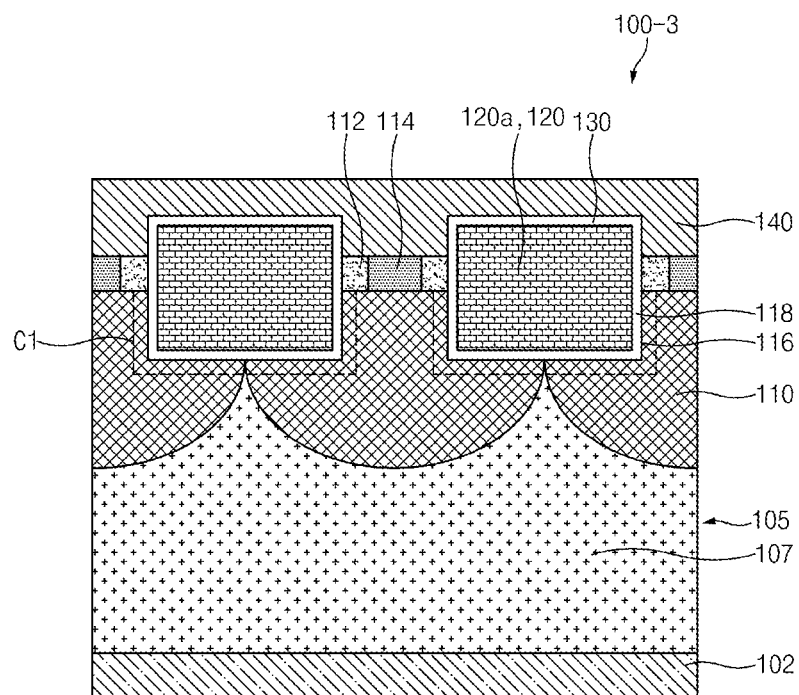

Referring to FIG. 41, the interlayer insulating layer 130 may be formed on the gate electrode layer 120.

Afterwards, the source electrode layer 140 may be formed on the interlayer insulating layer 130. In addition, the source electrode layer 140 may be formed to be connected with the source regions 112 and the well contact regions 114. For example, the source electrode layer 140 may be formed by forming a conductive layer, for example, a metal layer on the interlayer insulating layer 130 and patterning the conductive layer.

According the fabricating method described above, the MOSFET structure having the hexagonal closed packed arrangement in the semiconductor layer 105 may be economically formed.

A power semiconductor device according to an embodiment of the present disclosure, which is described above, may make it possible to improve the degree of integration through the high channel density and to improve reliability through the protection of a trench corner.

Of course, these effects are exemplary, and the scope of the invention is not limited by these effects.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A power semiconductor device comprising:
   a semiconductor layer of silicon carbide (SiC);
   a plurality of well regions disposed in the semiconductor layer, spaced from each other and having a second conductivity type;
   a plurality of source regions disposed in the semiconductor layer on the plurality of well regions respectively, spaced from each other and having a first conductivity type;
   a drift region having the first conductivity type and disposed in the semiconductor layer, the drift region extending from a lower side of the plurality of well regions to a surface of the semiconductor layer through between the plurality of well regions;
   a plurality of trenches disposed to be recessed to an inside of the semiconductor layer from the surface of the semiconductor layer such that each of the plurality of trenches connects two source regions adjacent to each other from among the plurality of source regions;
   a gate insulating layer disposed on inner walls of the plurality of trenches and the surface of the semiconductor layer; and
   a gate electrode layer disposed on the gate insulating layer and including a first portion burying the plurality of trenches and a second portion on the surface of the semiconductor layer.

2. The power semiconductor device of claim 1, wherein distances between three well regions adjacent to each other from among the plurality of well regions are equal to each other, and
   wherein distances between three source regions adjacent to each other from among the plurality of source regions are equal to each other.

3. The power semiconductor device of claim 1, wherein the drift region includes a protrusion extending to the surface of the semiconductor layer between three well regions adjacent to each other from among the plurality of well regions, and
   wherein the second portion of the gate electrode layer is disposed on the protrusion of the drift region and two adjacent well regions of the three adjacent well regions.

4. The power semiconductor device of claim 1, wherein centers of seven well regions adjacent to each other from among the plurality of well regions are respectively disposed at a center and vertexes of a regular hexagon, and
   wherein centers of seven source regions being on the seven adjacent well regions from among the plurality of source regions are respectively disposed at the center and vertexes of the regular hexagon.

5. The power semiconductor device of claim 4, wherein the plurality of trenches include portions of lines each connecting two adjacent to each other from among the center and vertexes of the regular hexagon such that the seven adjacent source regions are connected.

6. The power semiconductor device of claim 1, further comprising:
   a first channel region restricted to the semiconductor layer so as to correspond to the first portion of the gate electrode layer and so as to be connected with the drift region and the source regions being in contact with the plurality of trenches along the plurality of trenches; and
   a second channel region under the second portion of the gate electrode layer and restricted to the semiconductor layer so as to be in contact with the plurality of source regions.

7. The power semiconductor device of claim 6, wherein the first channel region and the second channel region have the second conductivity type such that an inversion channel is formed, and
   wherein the first channel region and the second channel region are portions of the plurality of well regions.

8. The power semiconductor device of claim 6, wherein the first channel region has the second conductivity type such that an inversion channel is formed,
   wherein the second channel region has the first conductivity type such that an accumulation channel is formed,
   wherein the first channel region corresponds to portions of the plurality of well regions,
   wherein the second channel region is a portion of the drift region, and
   wherein the plurality of source regions are in contact with the drift region, on the surface of the semiconductor layer.

9. The power semiconductor device of claim 1, further comprising:
   a plurality of well contact regions disposed in the plurality of source regions and on the plurality of well regions and having the second conductivity type; and
   a source electrode layer connected with the plurality of source regions and the plurality of well contact regions.

10. The power semiconductor device of claim 9, wherein the plurality of well contact regions have a circular shape in a plan view, and
    wherein the plurality of source regions have a shape of a doughnut surrounding the plurality of well contact regions.

11. The power semiconductor device of claim 9, wherein the plurality of well regions have a shape in which a width thereof increases as the width goes to an inside of the semiconductor layer from the surface of the semiconductor layer and then decreases.

12. The power semiconductor device of claim 1, wherein opposite bottom corners of the first portion of the gate electrode layer are surrounded by the plurality of well regions.

13. The power semiconductor device of claim 1, further comprising:
    a drain region in the semiconductor layer under the drift region and having the first conductivity type,
    wherein the drift region includes an epitaxial layer on the drift region.

14. A power semiconductor device comprising:
    a semiconductor layer of silicon carbide (SiC);
    a plurality of well regions disposed in the semiconductor layer and having a second conductivity type;
    a plurality of source regions disposed in the semiconductor layer on the plurality of well regions respectively and having a first conductivity type;
    a drift region having the first conductivity type and disposed in the semiconductor layer, extending from a lower side of the plurality of well regions to a surface of the semiconductor layer through between the plurality of well regions, and providing a vertical transport path of charges;
a plurality of trenches disposed to be recessed to an inside of the semiconductor layer from the surface of the semiconductor layer such that each of the plurality of trenches connects two source regions adjacent to each other from among the plurality of source regions;
a gate insulating layer disposed on inner walls of the plurality of trenches and the surface of the semiconductor layer;
a gate electrode layer disposed on the gate insulating layer and including a first portion burying the plurality of trenches and a second portion on the surface of the semiconductor layer;
a first channel region restricted to the semiconductor layer such that an inversion channel extends along the plurality of trenches to correspond to the first portion of the gate electrode layer; and
a second channel region under the second portion of the gate electrode layer and restricted to the semiconductor layer such that an accumulation channel is formed.

15. The power semiconductor device of claim 14, wherein distances between three well regions adjacent to each other from among the plurality of well regions are equal to each other, and
wherein distances between three source regions adjacent to each other from among the plurality of source regions are equal to each other.

16. The power semiconductor device of claim 14, wherein the drift region includes a protrusion extending to the surface of the semiconductor layer between three well regions adjacent to each other from among the plurality of well regions, and
wherein the second portion of the gate electrode layer is disposed on the protrusion of the drift region and the two adjacent well regions of the three adjacent well regions.

17. The power semiconductor device of claim 14, wherein centers of seven well regions adjacent to each other from among the plurality of well regions are respectively disposed at a center and vertexes of a regular hexagon, and
wherein centers of seven source regions being on the seven adjacent well regions from among the plurality of source regions are respectively disposed at the center and vertexes of the regular hexagon.

18. A power semiconductor device comprising:
a semiconductor layer of silicon carbide (SiC);
a plurality of well regions disposed in the semiconductor layer such that two adjacent well regions at least partially contact each other and having a second conductivity type;
a plurality of source regions disposed in the semiconductor layer on the plurality of well regions respectively and having a first conductivity type;
a drift region having the first conductivity type and disposed in the semiconductor layer, extending from a lower side of the plurality of well regions to a surface of the semiconductor layer through between the plurality of well regions, and providing a vertical transport path of charges;
a plurality of trenches disposed to be recessed to an inside of the semiconductor layer from the surface of the semiconductor layer such that each of the plurality of trenches connects two source regions adjacent to each other from among the plurality of source regions across a place where two well regions adjacent to each other from among the plurality of source regions contact each other;
a gate insulating layer disposed on inner walls of the plurality of trenches and the surface of the semiconductor layer; and
a gate electrode layer disposed on the gate insulating layer and including a first portion burying the plurality of trenches and a second portion on the surface of the semiconductor layer.

19. The power semiconductor device of claim 18, wherein distances between three well regions adjacent to each other from among the plurality of well regions are equal to each other, and
wherein distances between three source regions adjacent to each other from among the plurality of source regions are equal to each other.

20. The power semiconductor device of claim 18, wherein the drift region includes a protrusion extending to the surface of the semiconductor layer between three well regions adjacent to each other from among the plurality of well regions, and
wherein the second portion of the gate electrode layer is disposed on the protrusion of the drift region and the two adjacent well regions of the three adjacent well regions.

* * * * *